United States Patent
Park et al.

(10) Patent No.: US 11,332,486 B2
(45) Date of Patent: May 17, 2022

(54) ALUMINUM COMPOUND AND METHOD FOR MANUFACTURING SEMICONDUCTOR DEVICE USING THE SAME

(71) Applicants: SAMSUNG ELECTRONICS CO., LTD., Suwon-si (KR); ADEKA CORPORATION, Tokyo (JP)

(72) Inventors: Gyu-Hee Park, Hwaseong-si (KR); Takanori Koide, Tokyo (JP); Yoshiki Manabe, Tokyo (JP); Masayuki Kimura, Tokyo (JP); Akio Saito, Tokyo (JP); Jaesoon Lim, Seoul (KR); Younjoung Cho, Hwaseong-si (KR)

(73) Assignees: SAMSUNG ELECTRONICS CO., LTD., Suwon-si (KR); ADEKA CORPORATION, Tokyo (JP)

( * ) Notice: Subject to any disclaimer, the term of this patent is extended or adjusted under 35 U.S.C. 154(b) by 119 days.

(21) Appl. No.: 16/564,125

(22) Filed: Sep. 9, 2019

(65) Prior Publication Data
US 2020/0207790 A1    Jul. 2, 2020

(30) Foreign Application Priority Data
Dec. 26, 2018 (KR) .................. 10-2018-0169699

(51) Int. Cl.
| | | |
|---|---|---|
| *C07F 5/06* | (2006.01) | |
| *C09D 1/00* | (2006.01) | |
| *C09D 5/00* | (2006.01) | |
| *C23C 16/20* | (2006.01) | |
| *H01L 21/02* | (2006.01) | |

(52) U.S. Cl.
CPC .............. *C07F 5/066* (2013.01); *C07F 5/067* (2013.01); *C09D 1/00* (2013.01); *C09D 5/00* (2013.01); *C23C 16/20* (2013.01); *H01L 21/0228* (2013.01); *H01L 21/02178* (2013.01); *H01L 21/02205* (2013.01)

(58) Field of Classification Search
None
See application file for complete search history.

(56) References Cited

U.S. PATENT DOCUMENTS

| | | |
|---|---|---|
| 7,754,618 B2 | 7/2010 | Ahn et al. |
| 7,985,450 B2 | 7/2011 | Shin et al. |
| 8,367,561 B2 | 2/2013 | Maula et al. |
| 9,249,505 B2 | 2/2016 | Winter et al. |
| 9,255,324 B2 | 2/2016 | Koh et al. |
| 9,472,345 B2 | 10/2016 | Youn et al. |
| 9,663,538 B2 | 5/2017 | Yoshino et al. |
| 2015/0255267 A1 | 9/2015 | Tapily et al. |
| 2017/0288171 A1 | 10/2017 | Ito |
| 2017/0327944 A1 | 11/2017 | Ding et al. |
| 2018/0019135 A1 | 1/2018 | Park et al. |
| 2018/0076024 A1 | 3/2018 | Park et al. |
| 2018/0197770 A1 | 7/2018 | Rainville et al. |

FOREIGN PATENT DOCUMENTS

| | | | | |
|---|---|---|---|---|
| DE | 4202889 A1 | * | 8/1993 | .............. C07F 7/003 |
| WO | WO-9942492 A1 | * | 8/1999 | .............. C07F 5/066 |

* cited by examiner

*Primary Examiner* — Joseph R Kosack
(74) *Attorney, Agent, or Firm* — Sughrue Mion, PLLC

(57) ABSTRACT

Provided are an aluminum compound and a method for manufacturing a semiconductor device using the same. The aluminum compound may be represented by Formula 1.

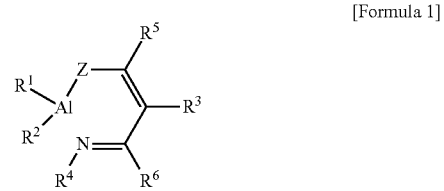

[Formula 1]

11 Claims, 27 Drawing Sheets

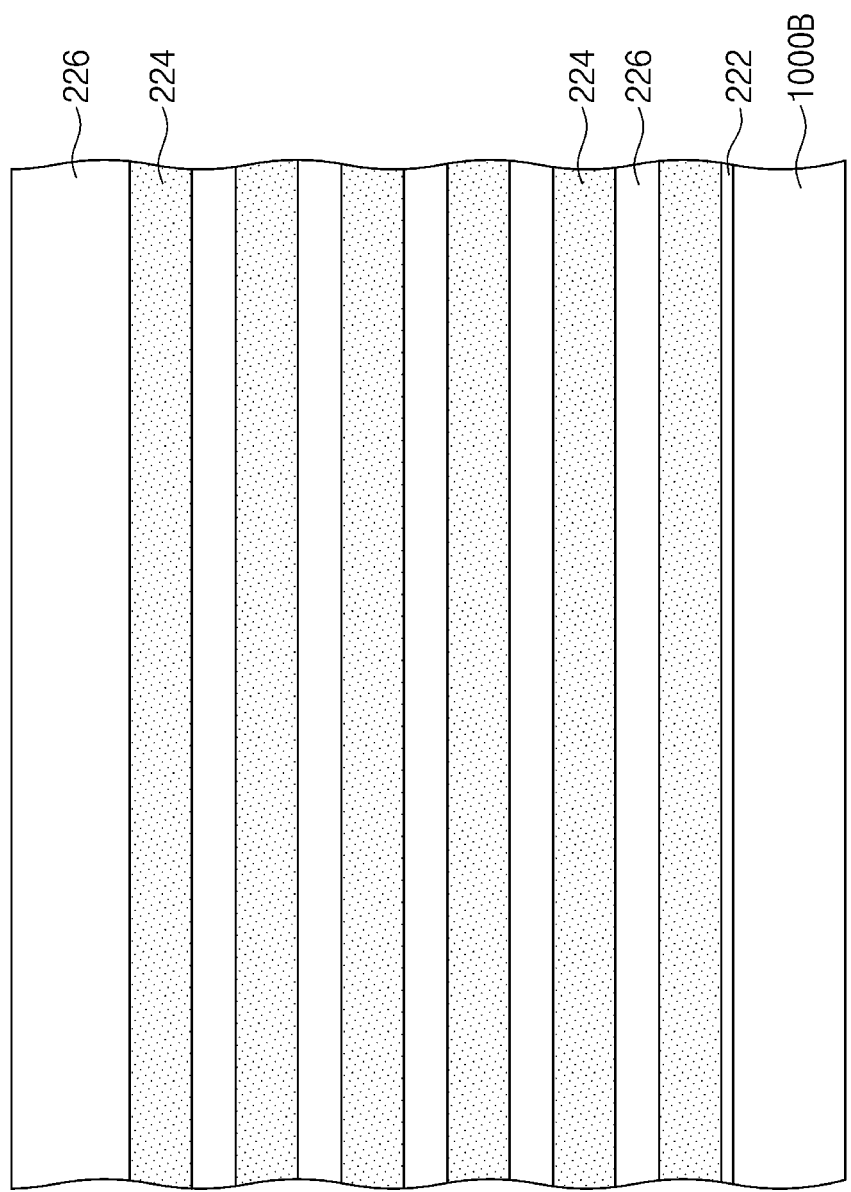

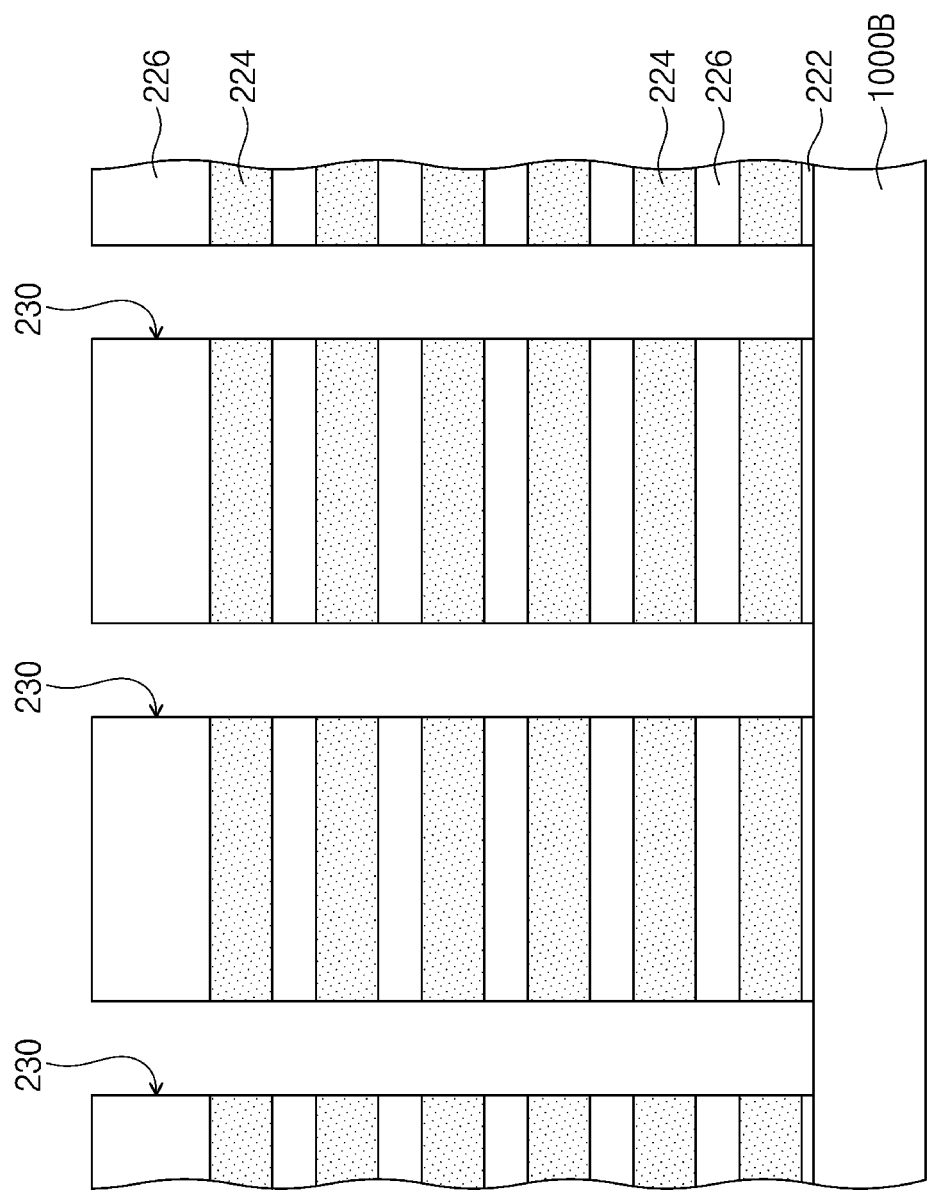

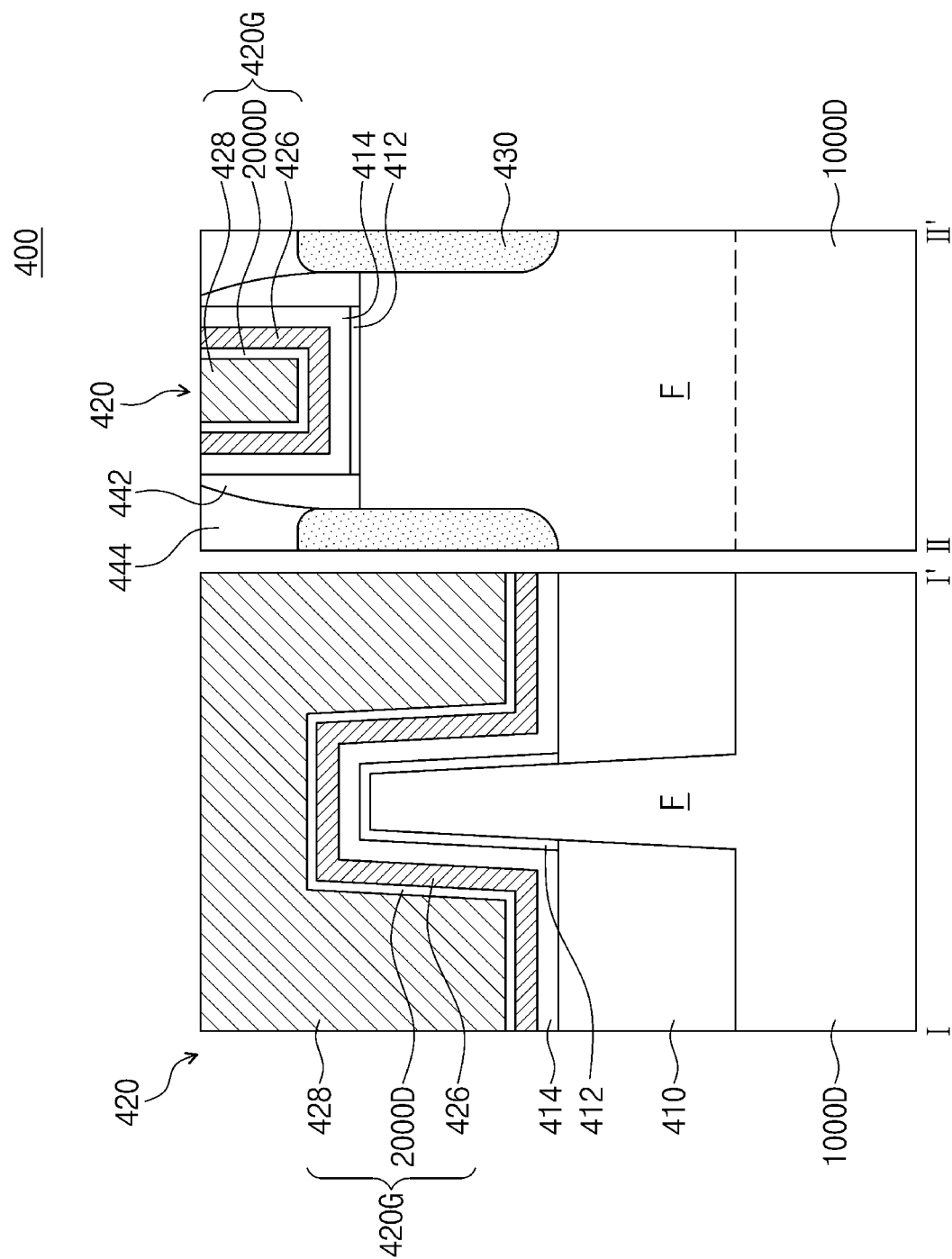

ALUMINUM COMPOUND AND METHOD FOR MANUFACTURING SEMICONDUCTOR DEVICE USING THE SAME

CROSS-REFERENCE TO THE RELATED APPLICATIONS

This application claims priority from Korean Patent Application No. 10-2018-0169699, filed on Dec. 26, 2018, the disclosure of which is incorporated herein by reference in its entirety.

BACKGROUND

Exemplary embodiments of the inventive concept relate to an aluminum compound, a method for manufacturing a semiconductor device using the same, and a deposition process using the same.

Due to advances in electronic technology, recently, downscaling of a semiconductor device is rapidly accelerating. Accordingly, the structure of patterns constituting a semiconductor device is being complicated and miniaturized. According to this, the development of a raw material compound which is capable of forming a thin film with a uniform thickness in a complicated and minute three-dimensional structure by securing thermal stability during forming a thin film including aluminum is required.

SUMMARY

An exemplary embodiment of the inventive concept provides a deposition precursor having thermal stability and transportation availability.

An exemplary embodiment of the inventive concept provides a method for manufacturing a semiconductor device including forming a thin film with a thin thickness and improved properties.

Exemplary embodiments of the inventive concept provide an aluminum compound and a method for manufacturing a semiconductor device using the same. The aluminum compound according to an aspect of the inventive concept may be represented by Formula 1.

[Formula 1]

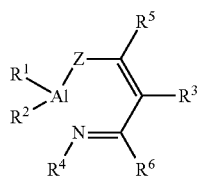

The method for manufacturing a semiconductor device according an aspect of to the inventive concept comprises preparing a deposition precursor including an aluminum compound; and forming a thin film using the deposition precursor, wherein the aluminum compound may be represented by Formula 1.

[Formula 1]

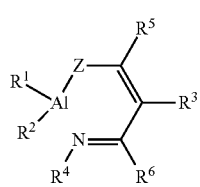

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIG. 5A to FIG. 5I are diagrams for explaining a method for manufacturing a semiconductor device according to exemplary embodiments;

FIG. 7C is a cross-section taken along lines I-I' and II-II' in FIG. 7A; and

DETAILED DESCRIPTION

Figure 1:
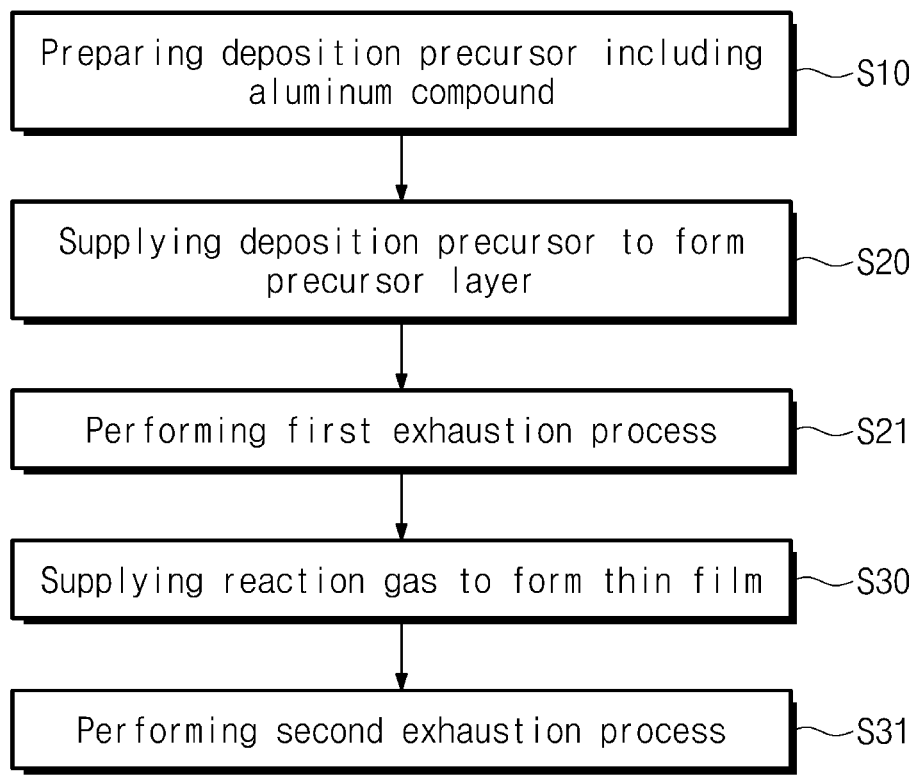
FIG. 1 is a diagram for explaining a deposition process using an aluminum compound according to exemplary embodiments.

In the disclosure, "substituted or unsubstituted" may mean substituted or unsubstituted with one or more substituents selected from the group consisting of a hydrogen atom, a deuterium atom, a halogen atom, cycloalkyl, aryl, heteroaryl, heteroalicyclic, hydroxyl, alkoxy, aryloxy, alkylthio, arylthio, cyano, halogen, carbonyl, amino and the derivatives thereof. In addition, each of the exemplified substituents may be substituted or unsubstituted. For example, a methylamino group may be interpreted as an amino group.

In the disclosure, an alkyl group may be a linear alkyl group, a branched alkyl group, or a cyclic alkyl group. The carbon number of the alkyl group is not specifically limited, but may be an alkyl group of 1 to 6 carbon atoms.

In the disclosure, the carbon number of amine/amino groups is not specifically limited, but may be 1 to 6. The amine may include at least one selected from the group consisting of aliphatic amine of 1 to 6 carbon atoms and cyclic amine of 3 to 6 carbon atoms. The amino group may include an alkylamino group. The alkylamino group may include a monoalkyl amino group and a dialkyl amino group.

In the disclosure, a halogen atom may include fluorine (F), chlorine (Cl), bromine (Br), and iodine (I).

In case where a chemical bond is not drawn at a position where a chemical bond is required to be drawn, it may mean that a hydrogen bond is bonded to the position, unless otherwise defined in a chemical formula. In the disclosure, room temperature may mean about 25° C.

In the disclosure, the same reference numeral may refer to the same constituent element throughout the disclosure.

Hereinafter, an aluminum compound according to an aspect of the inventive concept and a method for preparing the same will be explained.

According to an aspect of the inventive concept, an aluminum compound may be represented by Formula 1 below.

[Formula 1]

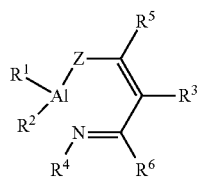

In Formula 1, $R^1$ and $R^2$ are each independently any one selected from the group consisting of an alkyl group of 1 to 6 carbon atoms, a dialkylamino group of 2 to 6 carbon atoms, an alkoxide group of 1 to 6 carbon atoms, and a halogen atom, Z is O or $N—R^7$, $R^3$ is any one selected from the group consisting of hydrogen, deuterium and an alkyl group of 1 to 6 carbon atoms, $R^4$ and $R^7$ are each independently any one selected from the group consisting of hydrogen, deuterium, alkyl of 1 to 6 carbon atoms and (dialkylamino)alkyl of 3 to 10 carbon atoms, and $R^5$ and $R^6$ are each independently any one selected from the group consisting of hydrogen, deuterium, and an alkyl group of 1 to 6 carbon atoms.

In Formula 1, if $R^1$, $R^2$, $R^3$, $R^4$, $R^5$, $R^6$ and $R^7$ are alkyl groups, the carbon number of the alkyl group may be 1 to 6, or 1 to 4. The carbon number of the (dialkylamino)alkyl group may mean the total carbon number of the (dialkylamino)alkyl group.

In Formula 1, if Z is $N—R^7$, N may be bonded to Al.

In Formula 1, the alkyl group of 1 to 6 carbon atoms may include, for example, methyl, ethyl, propyl, isopropyl, butyl, isobutyl, sec-butyl, tert-butyl, pentyl, amyl and/or isoamyl, and hexyl. However, an embodiment of the inventive concept is not limited thereto.

The dialkylamino of 2 to 6 carbon atoms may include, for example, dimethylamino, diethylamino, dipropylamino, diisopropylamino, ethylmethylamino, propylmethylamino, and/or isopropylmethylamino.

The alkoxide of 1 to 6 carbon atoms may include, for example, methoxy, ethoxy, propoxy, isopropoxy, butoxy, sec-butoxy, isobutoxy, tert-butoxy, pentoxy, isopentoxy, and/or tert-pentoxy.

The halogen atom may include F, Cl and/or Br.

The (dialkylamino)alkyl of 3 to 10 carbon atoms may include, for example, dimethylaminomethyl, ethylmethylaminomethyl, diethylaminomethyl, dimethylaminoethyl, ethylmethylaminoethyl, and/or diethylaminoethyl.

The aluminum compound represented by Formula 1 may be any one selected from Compound Group A.

[Compound Group A]

No.1
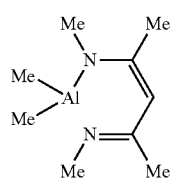

No.2
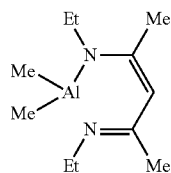

No.3
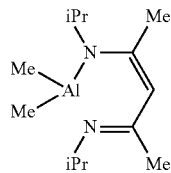

No.4
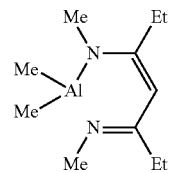

No.5
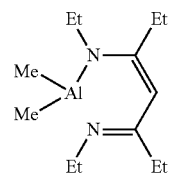

No.6
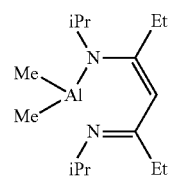

No.7
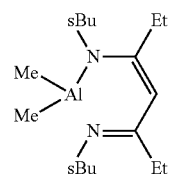

No.8
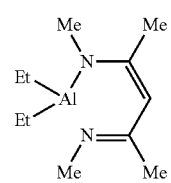

No.9
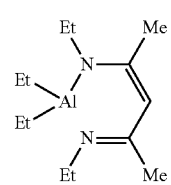

No.10
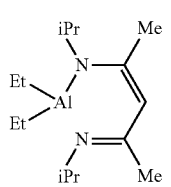

No.11
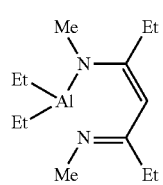
No.12
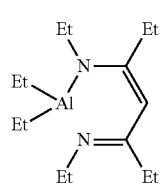
No.13
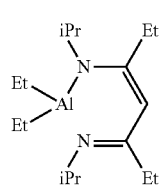
No.14
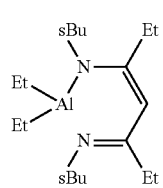
No.15
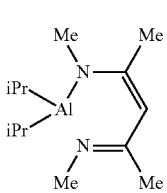
No.16
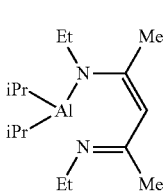
No.17
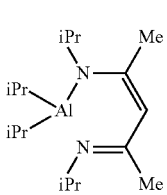
No.18
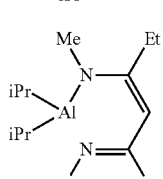
No.19
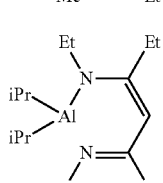
No.20
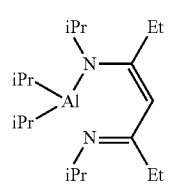
No.21
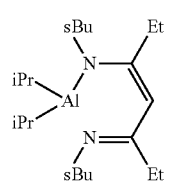
No.22
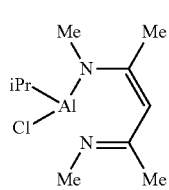
No.23
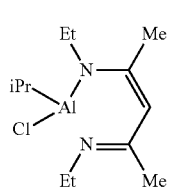
No.24
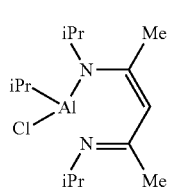
No.25
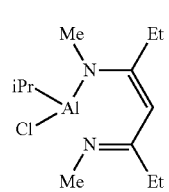
No.26
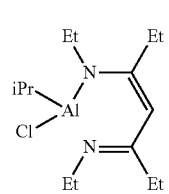
No.27
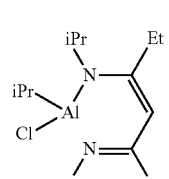
No.28
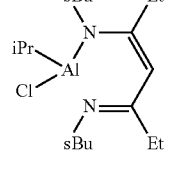

-continued
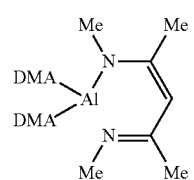
No.29
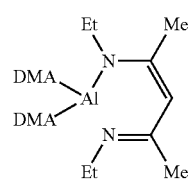
No.30
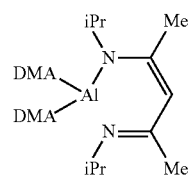
No.31
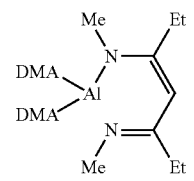
No.32
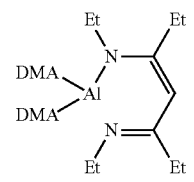
No.33
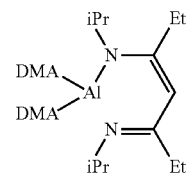
No.34
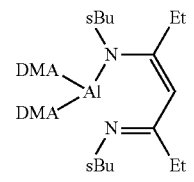
No.35
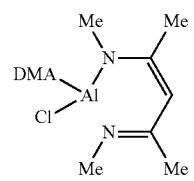
No.36
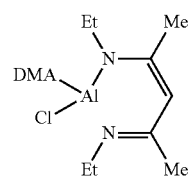
No.37
-continued
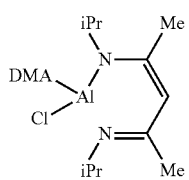
No.38
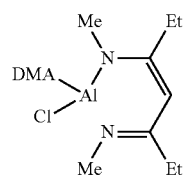
No.39
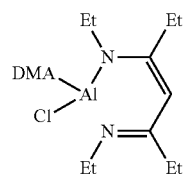
No.40
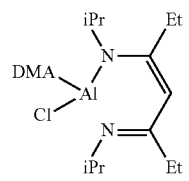
No.41
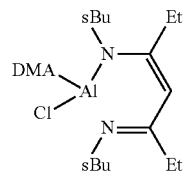
No.42
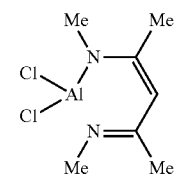
No.43
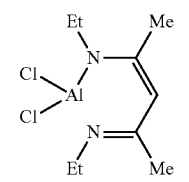
No.44
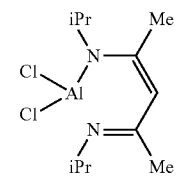
No.45
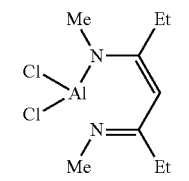
No.46

| No. | Structure |
|---|---|
| No.47 | Cl₂Al-N(Et)-C(Et)=CH-C(Et)=N-Et |
| No.48 | Cl₂Al-N(iPr)-C(Et)=CH-C(Et)=N-iPr |
| No.49 | Cl₂Al-N(sBu)-C(Et)=CH-C(Et)=N-sBu |
| No.50 | Me₂Al-O-C(Me)=CH-C(Me)=N-Me |
| No.51 | Me₂Al-O-C(Me)=CH-C(Me)=N-Et |
| No.52 | Me₂Al-O-C(Me)=CH-C(Me)=N-iPr |
| No.53 | Me₂Al-O-C(Et)=CH-C(Et)=N-Me |
| No.54 | Me₂Al-O-C(Et)=CH-C(Et)=N-Et |
| No.55 | Me₂Al-O-C(Et)=CH-C(Et)=N-iPr |
| No.56 | Me₂Al-O-C(iPr)=CH-C(iPr)=N-Me |
| No.57 | Me₂Al-O-C(iPr)=CH-C(iPr)=N-Et |
| No.58 | Me₂Al-O-C(iPr)=CH-C(iPr)=N-iPr |
| No.59 | Et₂Al-O-C(Me)=CH-C(Me)=N-Me |
| No.60 | Et₂Al-O-C(Me)=CH-C(Me)=N-Et |
| No.61 | Et₂Al-O-C(Me)=CH-C(Me)=N-iPr |
| No.62 | Et₂Al-O-C(Et)=CH-C(Et)=N-Me |
| No.63 | Et₂Al-O-C(Et)=CH-C(Et)=N-Et |
| No.64 | Et₂Al-O-C(Et)=CH-C(Et)=N-iPr |

No.65 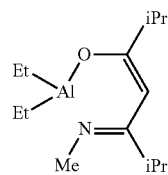
No.66 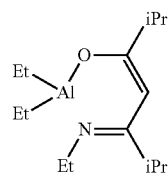
No.67 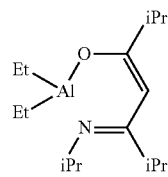
No.68 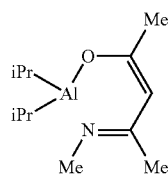
No.69 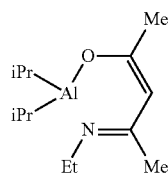
No.70 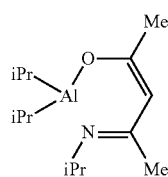
No.71 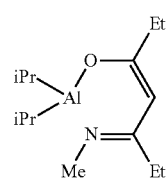
No.72 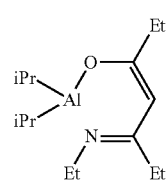
No.73 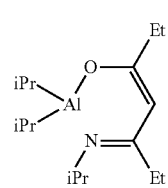
No.74 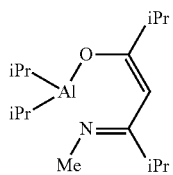
No.75 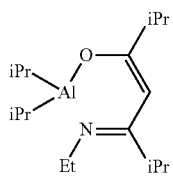
No.76 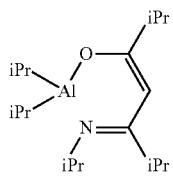
No.77 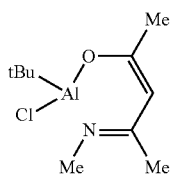
No.78 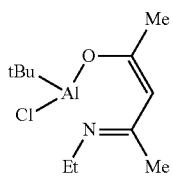
No.79 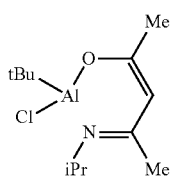
No.80 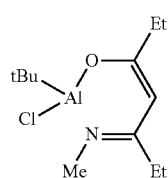
No.81 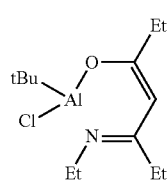
No.82 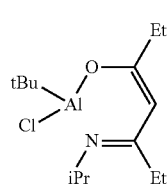

No.83

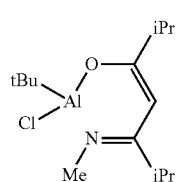

No.84

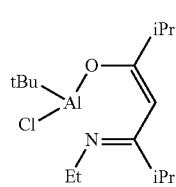

No.85

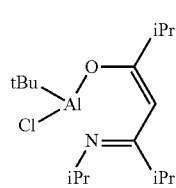

In No. 1 to No. 85 in Compound Group A, Me is a methyl group, Et is an ethyl group, iPr is an isopropyl group, sBu is a sec-butyl group, tBu is a tert-butyl group, and DMA is a dimethylamino group.

iPr may be represented by Formula 2A below.

[Formula 2A]

sBu may be represented by Formula 2B below.

[Formula 2B]

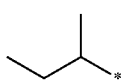

tBu may be represented by Formula 2C below.

[Formula 2C]

DMA may be represented by Formula 2D below.

[Formula 2D]

In Formula 2A to 2D, * means a combined part to a corresponding one among C, N and O in No. 1 to No. 85 in Compound Group A.

The aluminum compound may be used as a deposition precursor. For example, the aluminum compound may be used as a deposition precursor of an atomic layer deposition, or a deposition precursor of a chemical vapor deposition (CVD). With the increase of the stability (for example, thermal stability) of the deposition precursor, the properties of a film deposited may be improved.

According to exemplary embodiments, the aluminum compound may have an aluminum-nitrogen (Al—N) bond or an aluminum-oxygen (Al—O) bond (in Formula 1, Al—Z bond). In case where aluminum makes a direct bonding with nitrogen or oxygen, the bonding force between aluminum and other element bonded to aluminum may increase. That is, as an aluminum-nitrogen (Al—N) bond or an aluminum-oxygen (Al—O) bond is provided, the bonding force between aluminum and $R^1$, and the bonding force between aluminum and $R^2$ may increase. Accordingly, the aluminum compound may have excellent stability.

The aluminum compound may include nitrogen at position 5 as in Formula 3 below, and the nitrogen may include an unshared electron pair. The unshared electron pair of the nitrogen may interact with aluminum as shown by dotted line. The interaction between aluminum and nitrogen at position 5 may be an intramolecular interaction. Due to the interaction, the aluminum compound may form a hexagonal ring structure. A compound with the hexagonal ring structure may be stable. Accordingly, the stability of the aluminum compound may increase even more.

[Formula 3]

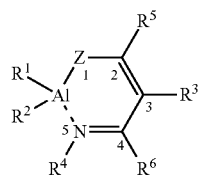

In Formula 3, $R^1$, $R^2$, $R^3$, $R^4$, $R^5$, $R^6$ and Z are the same as defined in Formula 1.

The aluminum compound may have a conjugation system and form a resonance structure. Accordingly, the stability of the aluminum compound may be improved.

The stability of the aluminum compound may include thermal stability. For example, the aluminum compound may have a relatively high thermal decomposition temperature. The aluminum compound may have a thermal decomposition temperature of about 300° C. to about 600° C. In case where the aluminum compound is used as the deposition precursor, the properties of a deposited thin film may be improved. The thin film may have high density. In case where the aluminum compound has a thermal decomposition temperature lower than about 300° C., the properties of the deposited thin film may be degraded or the conditions of a deposition process may be limited.

In case where the aluminum compound is used as the deposition precursor, the deposition process may have a relatively wide deposition window. The deposition window may mean a temperature range for performing a deposition process in case where using a certain deposition precursor. The deposition window may include an atomic layer deposition (ALD) window. The deposition process may be performed at a temperature lower than the thermal decomposition temperature of the deposition precursor. According to exemplary embodiments, the aluminum compound may have a high thermal decomposition temperature. In case where the aluminum compound is used as the deposition precursor, the deposition process may be performed even at a higher temperature. Accordingly, the limitation on the conditions of the deposition process may be reduced.

The aluminum compound may have a low melting point. The aluminum compound may have a melting point of, for example, about −50° C. to about 45° C. The aluminum compound may be a liquid state at room temperature (for example, about 25° C.). Energy required for transporting the aluminum compound in a liquid state may be small. Accordingly, the aluminum compound may be easily transported in a liquid state.

The aluminum compound may not include impurities or may include impurities in a low concentration. Impurities may mean materials different from the material represented by Formula 1. The impurities may include metal-containing impurities, halogen-containing impurities, and/or organic impurities.

The concentration of metal impurities may be lower than about 1 ppm. The concentration of the metal impurities may be about 0 to about 1 ppm. In the disclosure, an expression "the concentration of a certain impurities is about 0" may mean that impurities are not included. The concentration of the metal impurities may be about 100 ppb or less. In case where the metal impurities include a plurality of different metal elements, the concentration of each metal element may be about 100 ppb or less, or about 1 ppb or less. The metal impurities may include an alkali metal and/or an alkaline earth metal. If an insulating layer includes the metal element, the properties of the insulating layer may be deteriorated.

The halogen-containing impurities may include fluorine, chlorine, and/or bromine. The concentration of the halogen-containing impurities may be about 100 ppm or less. The concentration of the halogen-containing impurities may be about 10 ppm or about 1 ppm or less.

The concentration of the organic impurities may be about 500 ppm or less. The concentration of the organic impurities may be about 500 ppm or less, or 10 ppm or less.

The aluminum compound may not include humidity or may include a low concentration of humidity. The concentration of humidity (e.g. concentration of $H_2O$) in the aluminum compound may be about 100 ppm or less, or about 1 ppm or less.

In case where the aluminum compound is a liquid state, the impurities may be present in a particle state. The content of the impurity particles may be low. The impurity particles may have a small diameter. If the diameter of the impurity particles is greater than about 0.3 jam, the impurity particles may be about 100 or less in about 1 ml of the aluminum compound. If the diameter of the impurity particles is greater than about 0.2 m, the impurity particles may be about 100 or less in about 1 ml of the aluminum compound.

If the precursor includes impurities, contamination particles may be formed in the deposited thin film or on the deposited thin film. According to exemplary embodiments, the aluminum compound may not include impurities or may include a very low concentration of impurities. Accordingly, the deposited thin film may show excellent properties.

The aluminum compound according to exemplary embodiments may have a high vapor pressure or may be easily vaporized. If a deposition precursor including the aluminum compound is used, a deposition process may be easily performed.

The aluminum compound may be prepared using a diketimine compound or a ketoimine compound as a reactant. Particular preparation examples of the aluminum compound will be explained in Experimental Example 1 to Experimental Example 12.

Hereinafter, a deposition process and a method for forming a thin film using an aluminum compound will be explained.

Figure 2:
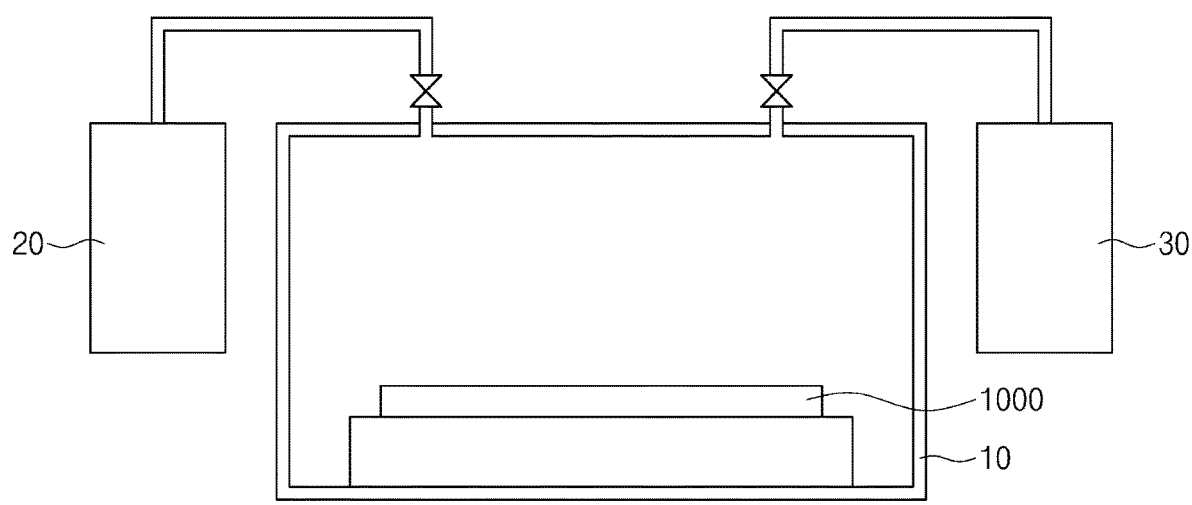
FIG. 2 is a diagram schematically showing a deposition system according to exemplary embodiments.
Figure 3A:
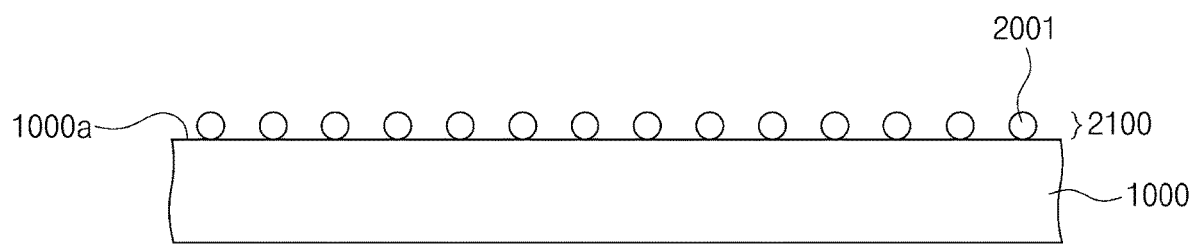
FIG. 3A and FIG. 3B are diagrams for explaining forming of a thin film according to exemplary embodiments.
Figure 3B:
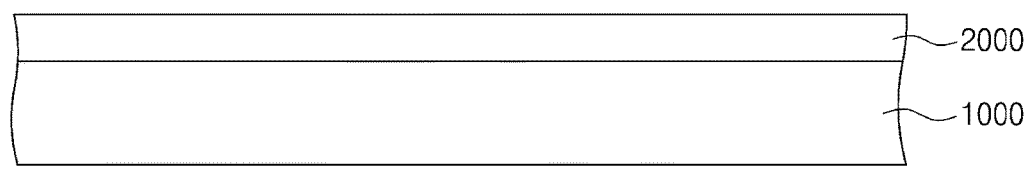

FIG. 1 is a diagram for explaining a deposition process using an aluminum compound according to exemplary embodiments. FIG. 2 is a diagram schematically showing a deposition system according to exemplary embodiments. FIG. 3A and FIG. 3B are diagrams for explaining the forming of a thin film according to exemplary embodiments.

Referring to FIG. 1, a deposition process may include preparing a deposition precursor including an aluminum compound (S10), supplying the deposition precursor to form a precursor layer (S20), and supplying a reaction gas to form a thin film (S30). The deposition process may further include performing a first exhaustion process (S21) and performing a second exhaustion process (S31). The deposition process may be an atomic layer deposition process.

Referring to FIG. 1 and FIG. 2, a deposition system 1 may include a chamber 10, a precursor supplying unit 20, and a reaction gas supplying unit 30. The deposition system 1 may be used for an atomic layer deposition process. Differently, the deposition system 1 may be used for a chemical vapor deposition process. A substrate 1000 may be loaded in the chamber 10. The substrate 1000 may be a wafer substrate such as a semiconductor substrate.

A deposition precursor 2001 including an aluminum compound may be prepared (S10). The deposition precursor 2001 may be transported and supplied into the precursor supplying unit 20. The aluminum compound has a low melting point, and the deposition precursor 2001 may be easily transported in a liquid state. For example, the aluminum compound may be supplied into a precursor cylinder in a liquid state. The precursor supplying unit 20 may be configured to dispose the precursor cylinder therein. In another embodiment, the aluminum compound may be dissolved in an organic solvent to prepare a precursor solution. If the deposition precursor is supplied in a precursor solution state, the deposition precursor with respect to the organic solvent may be about 0.01 mol/L to about 2.0 mol/L, or about 0.05 mol/L to about 1.0 mol/L. The precursor solution may be supplied into the precursor cylinder. After that, the precursor cylinder may be disposed in the precursor supplying unit 20. The precursor supplying unit 20 may supply the deposition precursor to the inner space of the chamber 10.

The organic solvent may include acetic ester solvents, ether solvents, ketone solvents, hydrocarbon solvents and/or heteroaromatic cyclic solvents. The humidity concentration in the organic solvent may be about 10 ppm or less, or about 1 ppm or less. The acetic ester solvent may include ethyl acetate, butyl acetate and/or methoxyethyl acetate. The ether solvent may include tetrahydrofuran, tetrahydropyrane, ethylene glycol dimethyl ether, diethylene glycol dimethyl ether, triethylene glycol dimethyl ether, dibutyl ether, and/or dioxane. The ketone solvent may include methyl butyl ketone, methyl isobutyl ketone, ethyl butyl ketone, dipropyl ketone, diisobutyl ketone, methyl amyl ketone, cyclohexanone, and/or methylcyclohexanone.

The hydrocarbon solvent may include unsaturated hydrocarbon solvents and saturated hydrocarbon solvents. The hydrocarbon solvent may include hexane, cyclohexane, methylcyclohexane, dimethylcyclohexane, ethylcyclohexane, heptane, octane, toluene, and/or xylene. The hydrocarbon solvent may be a hydrocarbon solvent having a cyano group. In this case, the hydrocarbon solvent having a cyano group may include 1-cyanopropane, 1-cyanobutane, 1-cyanohexane, cyanocyclohexane, cyanobenzene, 1,3-dicyanopropane, 1,4-dicyanobutane, 1,6-dicyanohexane, 1,4-dicyanocyclohexane, and/or 1,4-dicyanobenzene. The heteroaromatic cyclic solvent may include pyridine and/or lutidine.

The deposition precursor 2001 may further include an additional precursor in addition to the aluminum compound. The additional precursor may be supplied into the chamber 10 via a supplying path and may be supplied into the chamber 10 separately from the aluminum compound. In another embodiment, the aluminum compound and the additional precursor may be mixed to prepare a mixture precursor. The mixture precursor may be supplied into the chamber 10. The additional precursor may include at least one selected from the group consisting of a semiconductor compound, a metal compound and an organic compound. However, an embodiment of the inventive concept is not limited thereto. The concentration of humidity in the additional precursor may be about 10 ppm or less, or about 1 ppm or less.

The semiconductor compound may include silicon and/or germanium.

The metal compound may include magnesium, calcium, strontium, barium, titanium, zirconium, hafnium, vanadium, niobium, tantalum, manganese, iron, ruthenium, cobalt, rhodium, iridium, nickel, palladium, platinum, copper, argentum, aurum, zinc, gallium, indium, germanium, tin, lead, antimony, bismuth, yttrium, lanthanum, cerium, praseodymium, neodymium, promethium, samarium, europium, gadolinium, terbium, dysprosium, holmium, erbium, thulium, and/or ytterbium.

The organic compound may include at least one selected from the group consisting of alcohol compounds, glycol compounds, beta-diketone (β-diketone) compounds, cyclopentadiene compounds and amine compounds. The organic compound may supply an organic ligand, and the deposited thin film may include the organic ligand.

The alcohol compound may include, for example, an alkyl alcohol compound or an ether alcohol compound. The alkyl alcohol compound may mean an alcohol compound having an alkyl group. For example, the alkyl alcohol compound may include methanol, ethanol, propanol, isopropyl alcohol, butanol, sec-butyl alcohol, isobutyl alcohol, tert-butyl alcohol, pentyl alcohol, isopentyl alcohol, and/or tert-pentyl alcohol.

The ether alcohol compound may mean an alcohol compound having an ether group. For example, the ether alcohol compound may include 2-methoxyethanol, 2-ethoxyethanol, 2-butoxyethanol, 2-(2-methoxyethoxy)ethanol, 2-methoxy-1-methylethanol, 2-methoxy-1,1-dimethylethanol, 2-ethoxy-1,1-dimethylethanol, 2-isopropoxy-1,1-dimethylethanol, 2-butoxy-1,1-dimethylethanol, 2-(2-methoxyethoxy)-1,1-dimethylethanol, 2-propoxy-1,1-diethylethanol, 2-s-butoxy-1,1-diethylethanol, and/or 3-methoxy-1,1-dimethylpropanol.

The glycol compound may include, for example, 1,2-ethanediol, 1,2-propanediol, 1,3-propanediol, 2,4-hexanediol, 2,2-dimethyl-1,3-propanediol, 2,2-diethyl-1,3-propanediol, 1,3-butanediol, 2,4-butanediol, 2,2-diethyl-1,3-butanediol, 2-ethyl-2-Butyl-1,3-propanediol, 2,4-pentanediol, 2-methyl-1,3-propanediol, 2-methyl-2,4-pentanediol, 2,4-hexanediol, and/or 2,4-dimethyl-2,4-pentanediol.

The beta-diketone (β-diketone) compound may include an alkyl-substituted beta-diketone compound, a fluorine-substituted beta-diketone compound, and/or an ester-substituted beta-diketone compound. The alkyl-substituted beta-diketone compound may include acetylacetone, hexane-2,4-dione, 5-methylhexane-2,4-dione, heptane-2,4-dione, 2-methylheptane-3,5-dione, 5-methylheptane-2,4-dione, 6-methylheptane-2,4-dione, 2,2-dimethylheptane-3,5-dione, 2,6-dimethylheptane-3,5-dione, 2,2,6-trimethylheptane-3,5-dione, 2,2,6,6-tetramethylheptane-3,5-dione, octane-2,4-dione, 2,2,6-trimethyloctane-3,5-dione, 2,6-dimethyloctane-3,5-dione, 2,9-dimethylnonane-4,6-dione, 2-methyl-6-ethyldecane-3,5-dione, and/or 2,2-dimethyl-6-ethyldecane-3,5-dione. The fluorine-substituted beta-diketone compound may include 1,1,1-trifluoropentane-2,4-dione, 1,1,1-trifluoro-5,5-dimethylhexane-2,4-dione, 1,1,1,5,5,5-hexafluoropentane-2,4-dione, and/or 1,3-diperfluorohexylpropane-1,3-dione. The ester-substituted beta-diketone compound may include 1,1,5,5-tetramethyl-1-methoxyhexane-2,4-dione, 2,2,6,6-tetramethyl-1-methoxyheptane-3,5-dione, and/or 2,2,6,6-tetramethyl-1-(2-methoxyethoxy)heptane-3,5-dione.

The cyclopentadiene compound may include cyclopentadiene, methylcyclopentadiene, ethylcyclopentadiene, propylcyclopentadiene, isopropylcyclopentadiene, butylcyclopentadiene, sec-butylcyclopentadiene, isobutylcyclopentadiene, tert-butylcyclopentadiene, dimethylcyclopentadiene, and/or tetramethylcyclopentadiene.

The amine compound may include methylamine, ethylamine, propylamine, isopropylamine, butylamine, sec-butylamine, tert-butylamine, isobutylamine, dimethylamine, diethylamine, dipropylamine, diisopropylamine, ethylmethylamine, propylmethylamine, and/or isopropylmethylamine.

As in FIG. 1, FIG. 2 and FIG. 3A, the deposition precursor 2001 may be supplied into the chamber 10 to form the precursor layer 2100 on the substrate 1000 (S20). The deposition precursor 2001 may include the above-explained aluminum compound. The deposition precursor 2001 may be adsorbed on the top surface 1000a of the substrate 1000 to form the precursor layer 2100. During supplying the deposition precursor 2001 into the chamber 10, the temperature of the substrate 1000 may be kept to about 25° C. to about 400° C., or about 200° C. to about 300° C. During supplying the deposition precursor 2001 into the chamber 10, the pressure of the chamber 10 may be about 10 Pa to about 1,013 hPa.

The deposition precursor 2001 may be supplied into the chamber 10 by a gas transportation method. The deposition precursor 2001 in a liquid state may be heated and the pressure may be decreased in the precursor supplying unit 20, and thus, the deposition precursor 2001 may be vaporized. In another embodiment, the deposition precursor 2001 may be supplied into the chamber 10 by a liquid transportation method. In this case, a separate vaporization chamber (not shown) may be provided between the precursor supplying unit 20 and the chamber 10. The deposition precursor 2001 may be supplied into the vaporization chamber in a liquid state. The deposition precursor 2001 may be heated and the pressure may be decreased in the vaporization chamber, and thus the deposition precursor 2001 may be vaporized. Accordingly, the deposition precursor 2001 in a gas state may be formed. The deposition precursor 2001 in a gas state may be supplied solely into the chamber 10 or may be supplied with a carrier gas into the chamber 10. The carrier gas may include an inert gas such as argon, nitrogen and helium.

After forming the precursor layer 2100, a first exhaustion process may be performed (S21). During performing the first exhaustion process, remaining deposition precursor 2001 and by-product gases may be removed from the chamber 10. The first exhaustion process may include a purge process, a pressure-decreasing process, or a combination thereof. For example, the purge process may be performed by supplying an inert gas into the chamber 10. The inert gas may include argon, nitrogen and/or helium. The pressure-decreasing process may include decreasing the pressure in the chamber 10. The pressure-decreasing process may be performed until the pressure in the chamber 10 becomes about 0.01 Pa to about 300 Pa, or about 0.01 Pa to about 100 Pa.

As in FIG. 1, FIG. 2 and FIG. 3B, a reaction gas may be supplied into the chamber 10 and a thin film may be formed (S30). The reaction gas may react with the precursor layer 2100. For example, the reaction gas may react with the deposition precursor 2001 adsorbed on the substrate 1000. Accordingly, the thin film 2000 may be formed on the substrate 1000. The reaction gas may include at least one selected from the group consisting of an oxidizing gas, a reducing gas and a nitrogen-containing gas. The oxidizing gas may include, for example, oxygen, ozone, nitrogen dioxide, nitric oxide, water vapor, hydrogen peroxide, acetic acid, and/or acetic anhydride. The reducing gas may include hydrogen. The nitrogen-containing gas may include an organic amine compound, a hydrazine compound and/or ammonia. The organic amine compound may include mono (alkyl)amine, dialkylamine, trialkylamine and/or alkylenediamine. In another embodiment, the reaction gas may include $NO_2$, $N_2O$ (nitrous oxide), $CO_2$, $H_2O_2$, HCOOH, $CH_3COOH$, and/or $(CH_3CO)_2O$. In case where the nitrogen-containing gas is used as the reaction gas, the deposited thin film 2000 may include an aluminum nitride layer or an aluminum-containing composite nitride layer. In case where the oxidizing gas is used as the reaction gas, the deposited thin film 2000 may include oxygen. For example, the deposited thin film 2000 may include an aluminum oxide layer or an aluminum-containing composite oxide layer. During supplying the reaction gas into the chamber 10, the temperature of the substrate 1000 may be kept to about 25° C. to about 400° C., or about 200° C. to about 300° C. During supplying the reaction gas into the chamber 10, the pressure of the chamber may be about 10 Pa to about 1,013 hPa.

According to exemplary embodiments, the temperature of the deposition process may be about 300° C. to about 600° C. The temperature of the deposition process may mean the temperature in the chamber 10. The temperature of the deposition process may include at least one of the temperature of the chamber 10 during the supplying the deposition precursor (S20) or the temperature of the chamber 10 during the supplying the reaction gas (S30).

In the step of supplying the reaction gas, the pressure of the chamber 10 may be about 10 Pa to about 1,013 hPa.

During the deposition process (S30), energy may be additionally supplied into the chamber 10. The energy may include at least one of plasma, light, heat or voltage. For example, the deposition process may be performed by atomic layer vapor deposition. The supplying of energy may be performed during at least one of supplying the precursor gas (S20), performing the first exhaustion process (S21), supplying the reaction gas (S30), or performing the second exhaustion process (S31). The deposition process may be performed by thermal CVD, plasma CVD, photo CVD, or photoplasma CVD.

According to exemplary embodiments, the material of the thin film 2000 may be determined according to the aluminum compound, the kind of the reaction gas and the kind of the additional deposition precursor 2001 in the deposition process. The thin film 2000 may include an aluminum-containing layer. The aluminum-containing layer may include metals, oxide ceramics, and/or nitride ceramics. The aluminum-containing layer may include, for example, an aluminum layer, an aluminum nitride layer, an aluminum oxide layer and/or an aluminum composite oxide layer. The aluminum composite oxide layer may include an aluminum oxynitride layer, an aluminum metal oxide layer and/or an aluminum oxycarbide layer. The aluminum composite oxide layer may include aluminum and a metal different from aluminum. In another embodiment, the aluminum composite oxide layer may include $AlSi_xO_y$, $ZrAl_xSiO_y$, $TiAl_xSi_xO_y$, and/or $HfAl_xSiO_y$ (where x and y are real numbers, respectively). For example, the aluminum composite oxide layer may include $AlSiO_{0.8-1.2}O_{3.1-3.9}$, $ZrAl_2SiO_7$, $TiAl_2SiO_7$, and/or $HfAl_2SiO_7$.

The deposition rate of the thin film 2000 may be controlled by the supplying conditions of the deposition precursor 2001, the temperature of the substrate 1000, and the pressure of the chamber 10. The supplying conditions of the deposition precursor 2001 may include the vaporization temperature of the deposition precursor 2001 and the pressure of the vaporized deposition precursor 2001. The thickness deposited per cycle of the thin film 2000 may be determined by the deposition rate. In case where the deposition process is performed by an atomic layer deposition method, the deposition rate may be evaluated by the thickness of the thin film 2000 deposited per cycle. In the explanation below, the thickness of the thin film 2000 may mean the thickness of the thin film 2000 deposited per cycle, unless otherwise referred to. The cycle may mean a process for forming a single number of the thin film 2000. For example, the supplying of the deposition precursor 2001 (S20), the performing the first exhaustion process (S21), the supplying of the reaction gas (S30), and the performing the second exhaustion process (S31) in FIG. 1 may constitute one cycle.

In case where the deposition rate is too slow (for example, less than about 0.01 nm/min), the productivity of the thin film 2000 may be degraded. In case where the deposition rate is too fast (for example, greater than about 100 nm/min), the thin film 2000 may be deposited to a large thickness. In addition, the properties of the thin film 2000 may be reduced. According to exemplary embodiments, the aluminum compound has thermal stability, and the deposition rate may be about 0.05 nm/min to about 100 nm/min, or about 1 nm/min to about 50 nm/min. Accordingly, the thin film 2000 may have a small thickness and may show improved properties. For example, the deposition thickness of the thin film 2000 per cycle may be about 0.05 Å to about 0.6 Å. According to exemplary embodiments, the thickness of the thin film 2000 may decrease, and the semiconductor device may be miniaturized and may have decreased pitch.

According to exemplary embodiments, groups including Z which is bonded to Al in Formula 1 may be relatively bulky. Accordingly, in case where an aluminum compound represented by Formula 1 is used, the thin film 2000 may be deposited to even smaller thickness.

After forming the thin film 2000, an annealing process may be further performed on the thin film 2000. The annealing process may be performed in an inert gas atmosphere, an oxidizing gas atmosphere, or a reducing gas atmosphere. By the annealing process, the electrical properties of the thin film 2000 may be improved. In this case, the electrical properties may include insulating properties. By the annealing process, the thin film 2000 may become denser.

After forming the thin film 2000, a reflow process may be further performed on the thin film 2000. By the reflow process, the step coverage of the thin film 2000 may be improved. The reflow process may be performed in conditions of about 250° C. to 1,000° C., or about 300° C. to about 500° C.

After forming the thin film 2000, a second exhaustion process may be performed (S31). During performing the second exhaustion process, reaction gases remaining after the reaction and by-product gases may be removed from the chamber 10. The second exhaustion process may include a purge process, a pressure-decreasing process, or a combination thereof, as explained above.

According to exemplary embodiments, after performing the supplying of the deposition precursor 2001 (S20), the supplying of the reaction gas (S30) may be performed. In another embodiment, the supplying of the reaction gas (S30) and the supplying of the deposition precursor 2001 (S20) may be performed at the same time. In this case, the performing the first exhaustion process (S21) may be omitted.

The above-explained forming process of the thin film 2000 may be performed in plural times on the substrate 1000. For example, the cycle of the forming process of the thin film 2000 may be repeated. In this case, the thin film 2000 may include a plurality of stacked thin films 2000. Accordingly, the total thickness of the thin films 2000 may be controlled.

According to exemplary embodiments, the thin film 2000 may be used as the wiring of an integrated circuit, a hard-coating layer of a component part, a gate insulating layer of a transistor, an insulating layer of a memory device, a dielectric layer of a capacitor, a magnetic resistant head of a hard disc, an optical glass of an optical communication circuit, and/or a catalyst. However, an embodiment of the inventive concept is not limited thereto.

FIG. 4A to FIG. 4J are diagrams for explaining a method for manufacturing a semiconductor device according to exemplary embodiments.

Figure 4A:
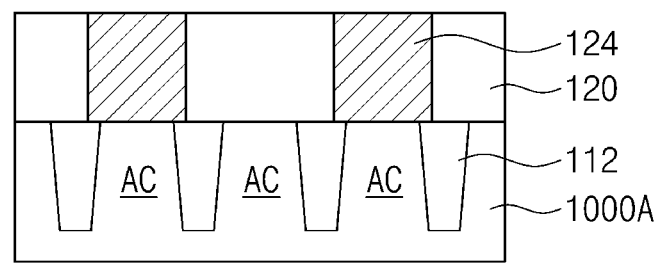
FIG. 4A to FIG. 4J are diagrams for explaining a method for manufacturing a semiconductor device according to exemplary embodiments.

Referring to FIG. 4A, a substrate 1000A including a plurality of active regions AC is prepared. The substrate 1000A may be a semiconductor substrate. The active regions AC may be defined by device isolation regions 112. The device isolation regions 112 may be disposed between the active regions AC. The device isolation regions 112 may include a silicon-based insulating material. The silicon-based insulating material may include a silicon oxide, a silicon nitride, a silicon oxynitride, or a combination thereof.

An insulating interlayer 120 may be formed on the substrate 1000A. The insulating interlayer 120 may include a silicon oxide layer. Conductive parts 124 may be formed in the insulating interlayer 120 and connected with the active regions AC. The conductive parts 124 may penetrate the insulating interlayer 120. A plurality of the conductive parts 124 may include a polysilicon, a metal, a conductive metal nitride, a metal silicide, or a combination thereof.

Figure 4B:
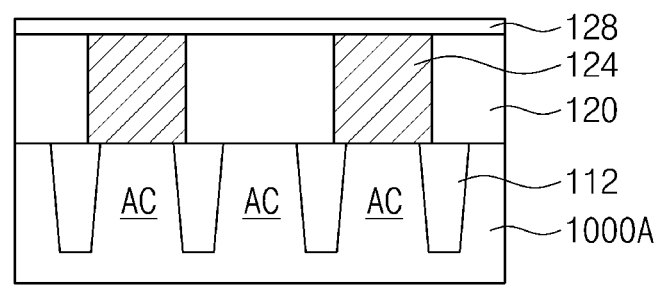

Referring to FIG. 4B, an insulating layer 128 may be formed on the insulating interlayer 120 and the conductive parts 124. The insulating layer 128 may act as an etch stopping layer. The insulating layer 128 may be formed using an insulating material having etching selectivity with respect to the insulating interlayer 120 and a mold layer (130 in FIG. 4C) which will be formed in a subsequent process. The insulating layer 128 may include, for example, a silicon-based insulating material.

Figure 4C:
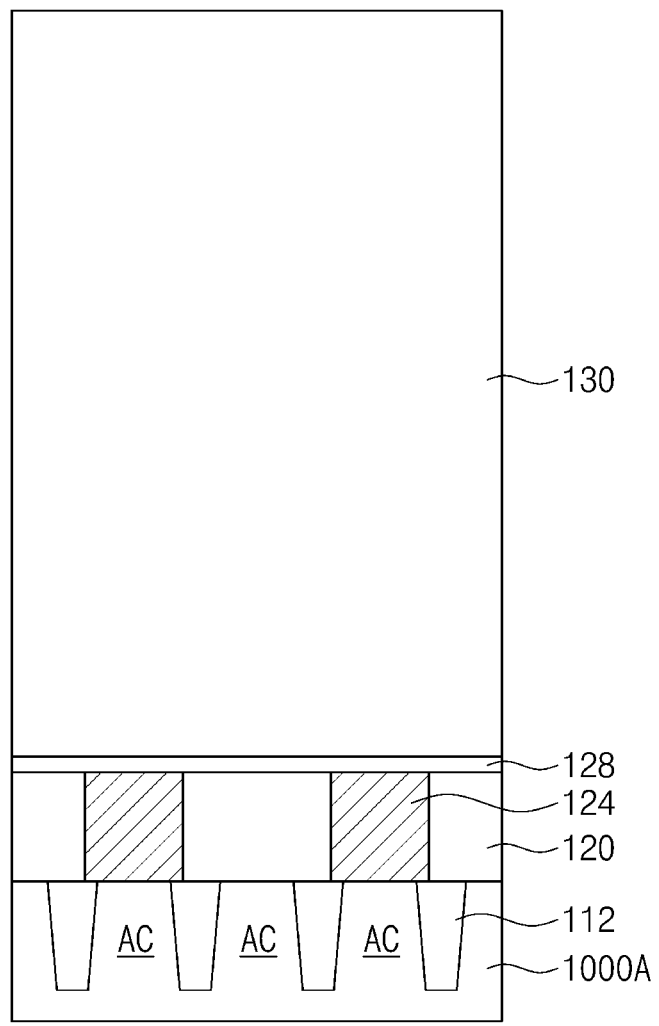

Referring to FIG. 4C, a mold layer 130 may be formed on the insulating layer 128. The mold layer 130 may include an oxide layer.

Figure 4D:
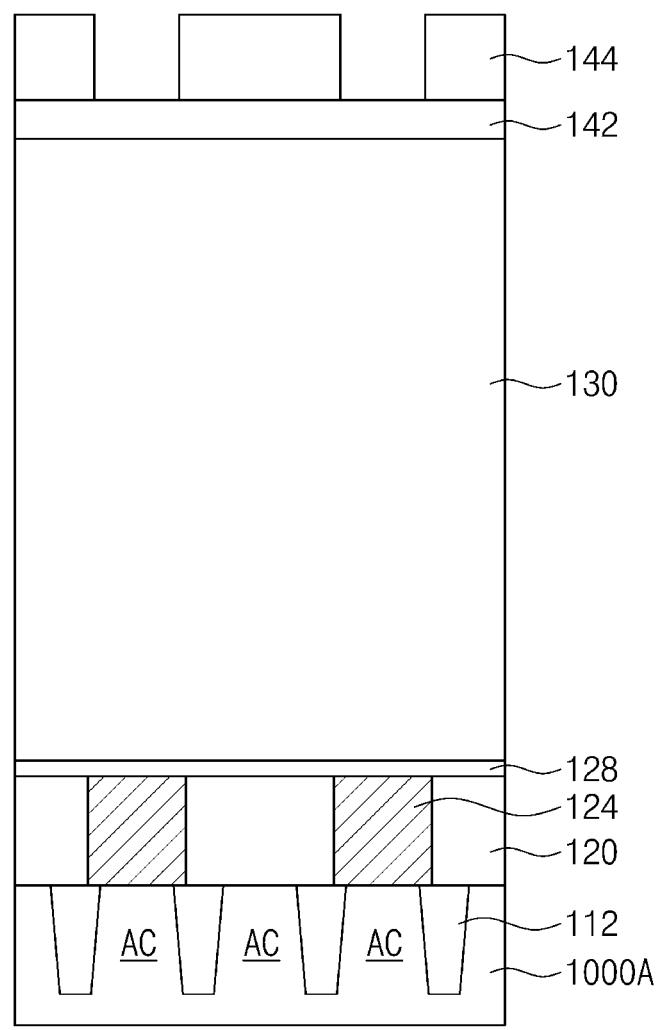

Referring to FIG. 4D, a sacrificing pattern 142 and a mask pattern 144 may be formed on the mold layer 130 in order. The sacrificing pattern 142 may include an oxide layer. The sacrificing pattern 142 may play the role of protecting the upper portion of the mold layer 130. The mask pattern 144 may include an oxide layer, a nitride layer, a polysilicon layer, a photoresist layer, or a combination thereof.

Figure 4E:
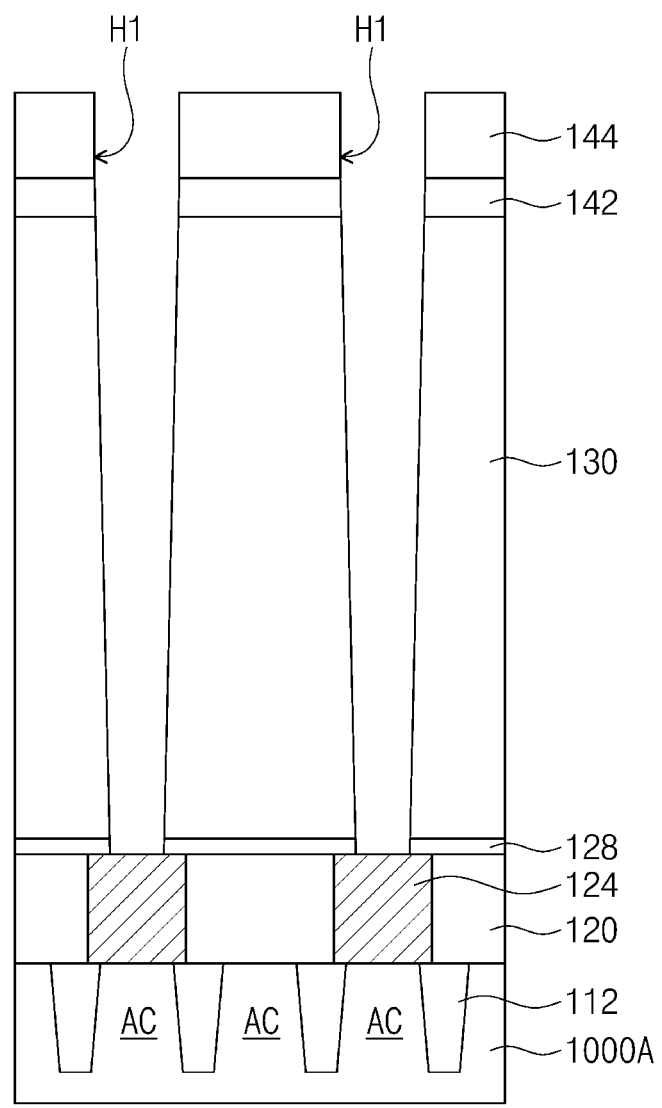

Referring to FIG. 4E, the sacrificing pattern 142 and the mold layer 130 may be etched using the mask pattern 144 as an etching mask. The etching may be drying etching. By the etching process, a plurality of holes H1 may be formed in the sacrificing pattern 142 and the mold layer 130. The holes H1 may be separated from each other and may penetrate the sacrificing pattern 142 and the mold layer 130. In this case, the insulating layer 128 may be etched further and the holes H1 may be extended into the insulating layer 128. The holes H1 may expose the conductive parts 124. After that, the mask pattern 144 may be removed to expose the top surface of the sacrificing pattern 142.

Figure 4F:
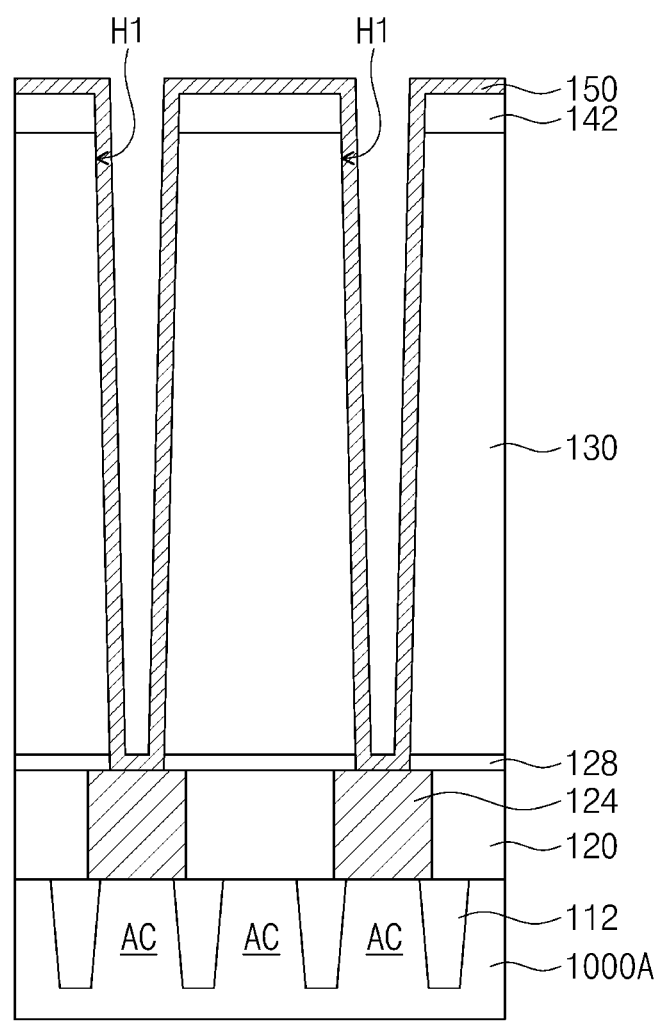

Referring to FIG. 4F, a conductive layer 150 may be formed in the holes H1 and on the sacrificing pattern 142. The conductive layer 150 may conformally cover the top surfaces of the conductive parts 124, the inner sidewall of the insulating layer 128, the inner sidewall of the mold layer 130, and the inner sidewall and top surface of the sacrificing pattern 142, which are exposed by the holes H1.

The conductive layer 150 may be formed using, for example, a doped semiconductor, a conductive metal nitride, a metal, a metal silicide, a conductive oxide, or a combination thereof. For example, the conductive layer 150 may be formed using TiN, TiAlN, TaN, TaAlN, W, WN, Ru, $RuO_2$, $SrRuO_3$, Ir, $IrO_2$, Pt, PtO, SRO ($SrRuO_3$), BSRO (($Ba,Sr)RuO_3$), CRO ($CaRuO_3$), LSCo (($La, Sr)CoO_3$), or a combination thereof. The conductive layer 150 may be formed by a deposition method. For example, the conductive layer 150 may be formed by a chemical vapor deposition (CVD), a metal organic chemical vapor deposition (MOCVD), or an atomic layer deposition (ALD).

Figure 4G:
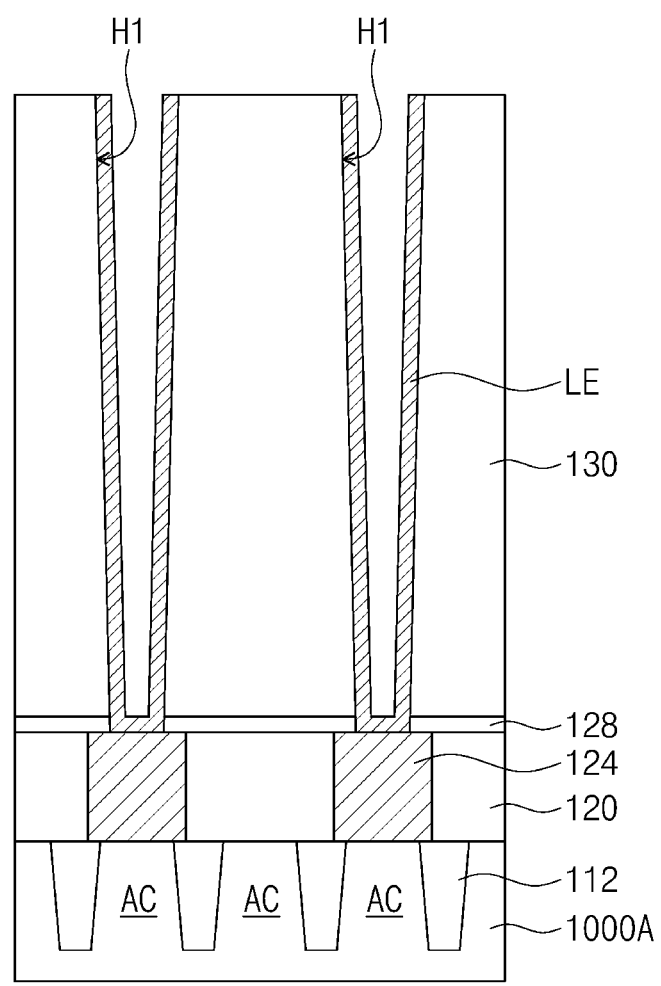

Referring to FIG. 4G, the upper portion of the conductive layer 150 may be removed and a plurality of lower electrodes LE may be formed. The removal of the conductive layer 150 may be performed by an etch back process or a chemical mechanical polishing (CMP) process. While performing the removing process of the conductive layer 150, the sacrificing pattern 142 may be removed together. The removal of the conductive layer 150 may be performed until the top surface of the mold layer 130 is exposed. The lower electrodes LE may each have a cylinder shape. Different from the drawing, the lower electrodes LE may be pillar shape lower electrodes without an inner space.

Figure 4H:
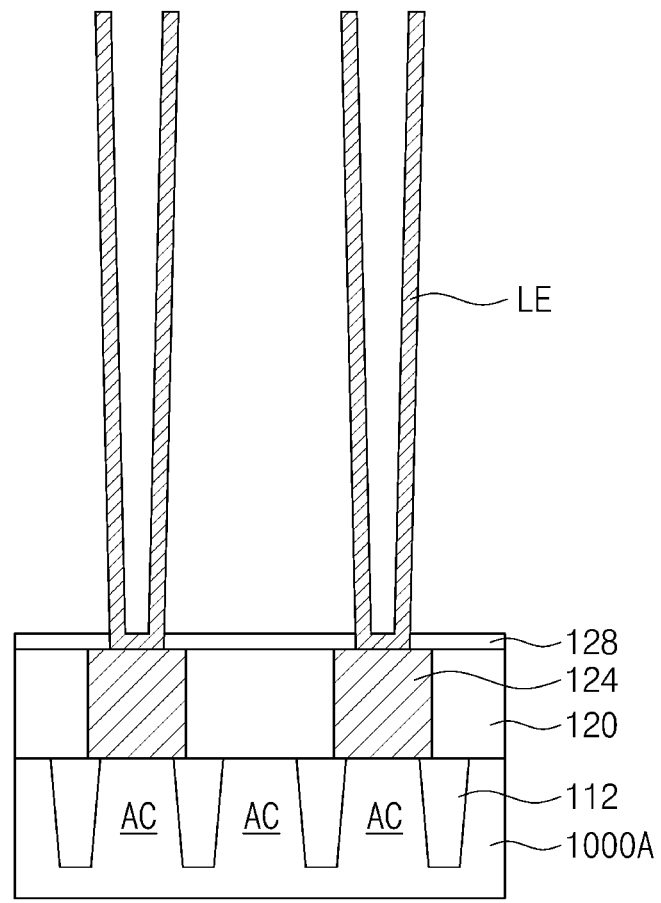

Referring to FIG. 4H, the mold layer 130 may be removed and the outer sidewalls of the lower electrodes LE and the top surface of the insulating layer 128 may be exposed. The mold layer 130 may be removed by an etching process. The etching process may include a wet etching process.

Figure 4I:
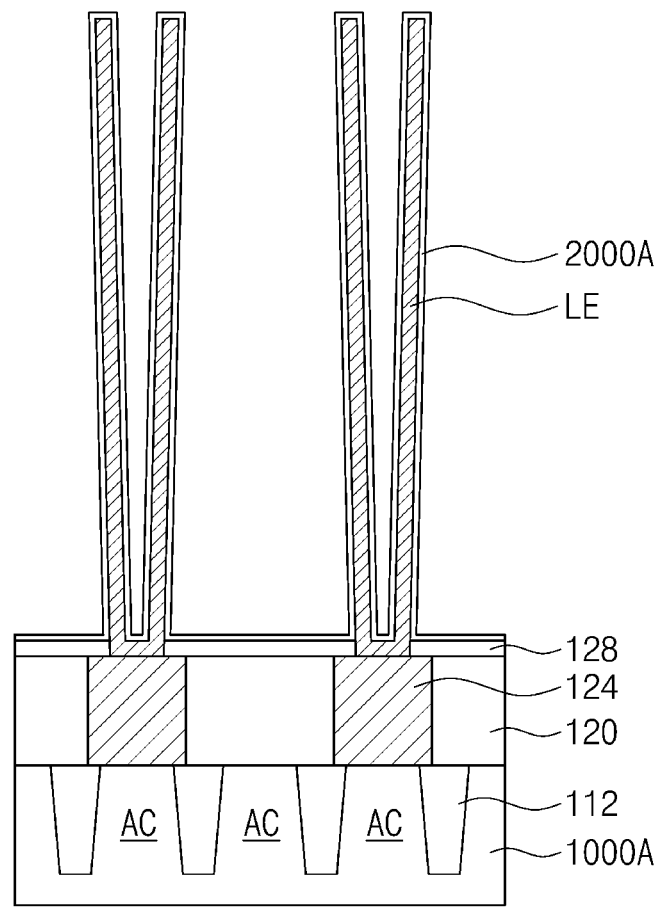

Referring to FIG. 4I, a dielectric layer 2000A may be formed to cover the lower electrodes LE. The dielectric layer 2000A may conformally cover the exposed surfaces of the lower electrodes LE. The exposed surfaces may include the inner sidewalls, outer sidewalls and top surfaces of the lower electrodes LE. The dielectric layer 2000A may further cover the top surface of the insulating layer 128.

The dielectric layer 2000A may be formed by the thin film forming method explained referring to FIG. 1, FIG. 2, FIG. 3A and FIG. 3B. For example, the dielectric layer 2000A may be formed by a deposition process using a deposition precursor including an aluminum compound. The deposition process may be an atomic layer deposition (ALD) process. The aluminum compound according to exemplary embodiments may have thermal stability and the dielectric layer 2000A may be formed into a small thickness. For example, the dielectric layer 2000A may be a single thin film and may have a thickness of about 0.05 Å to about 0.6 Å. In another embodiment, the dielectric layer 2000A may include a plurality of thin films, and each thin film may have a thickness of about 0.05 Å to about 0.6 Å. The dielectric layer 2000A may show excellent properties. The properties may include insulating properties.

The dielectric layer 2000A may include an aluminum-containing layer. In an embodiment, the dielectric layer 2000A may include an aluminum oxide layer and a high-k dielectric layer. In this case, the aluminum oxide layer may be formed by the thin film forming method explained referring to FIG. 1, FIG. 2, FIG. 3A and FIG. 3B. the high-k dielectric layer may include a hafnium oxide layer, a tantalum oxide layer and/or a zirconium oxide layer. The high-k dielectric layer may have a crystalline structure. With the decrease of the thickness of the aluminum oxide layer, the high-k dielectric layer may have even more improved crystalline structure. Accordingly, the dielectricity of the dielectric layer 2000A may be improved.

The lower electrodes LE may have a relatively large aspect ratio, and the capacitance of a capacitor (170 in FIG. 4) may be improved. According to exemplary embodiments, a deposition process using an aluminum compound as a deposition precursor may show excellent step coverage properties. Accordingly, the lower electrodes LE of the dielectric layer 2000A may be favorably sealed. The deposition process may be performed at about 300° C. to about 600° C. The formation of the dielectric layer 2000A may further include annealing at about 500° C. to about 1,150° C.

Figure 4J:
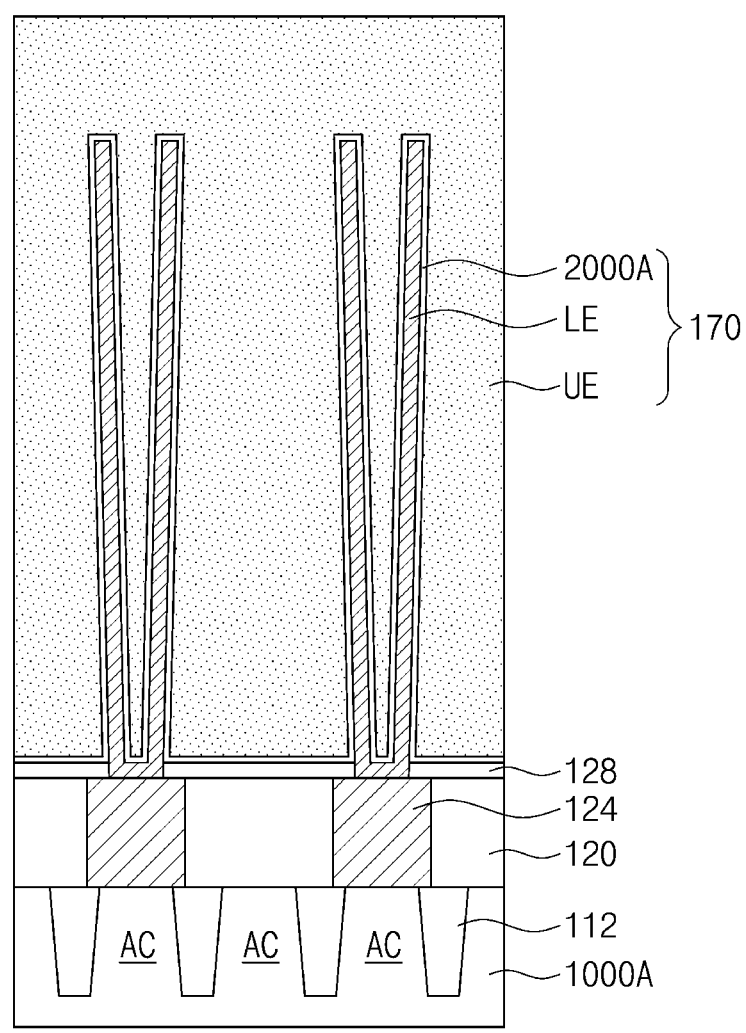

Referring to FIG. 4J, an upper electrode UE may be formed on the dielectric layer 2000A. The upper electrode UE may include a conductive material such as a doped semiconductor, a conductive metal nitride, a metal, a metal silicide, and a conductive oxide. The upper electrode UE may be formed by chemical vapor deposition (CVD), metal organic chemical vapor deposition (MOCVD), or atomic layer deposition (ALD). With the lower electrode LE, dielectric layer 2000A and upper electrode UE, a capacitor 170 may be formed.

By the forming method described until now, the manufacture of a semiconductor device 100 may be completed. The semiconductor device 100 may include the capacitor 170. The manufacturing process of the semiconductor device 100 may include depositing the dielectric layer 2000A.

FIG. 5A to FIG. 5I are diagrams for explaining a method for manufacturing a semiconductor device according to exemplary embodiments.

Referring to FIG. 5A, an etch stopping layer 222, sacrificing layers 224, and insulating layers 226 may be formed on a substrate 1000B. The substrate 1000B may include a semiconductor element such as Si and Ge. In another embodiment, the substrate 1000B may include a compound semiconductor such as SiC, GaAs, InAs and InP.

The etch stopping layer 222 may be formed on the top surface of the substrate 1000B. The etch stopping layer 222 may include, for example, a silicon oxide.

A plurality of the sacrificing layers 224 and a plurality of the insulating layers 226 may be alternately and repeatedly stacked on the etch stopping layer 222. The thickness of the uppermost insulating layer 226 may be greater than those of other insulating layers 226. The insulating layers 226 may include, for example, a silicon oxide. The sacrificing layers 224 may have an etching selectivity different from those of the etch stopping layer 222 and the insulating layers 226. The sacrificing layers 224 may include, for example, a silicon nitride layer, a silicon oxynitride layer, a polysilicon layer or a polysilicon germanium layer.

Referring to FIG. 5B, channel holes 230 may be formed to penetrate the insulating layers 226, the sacrificing layers 224 and the etch stopping layer 222. The channel holes 230 may expose the substrate 1000B.

Figure 5C:
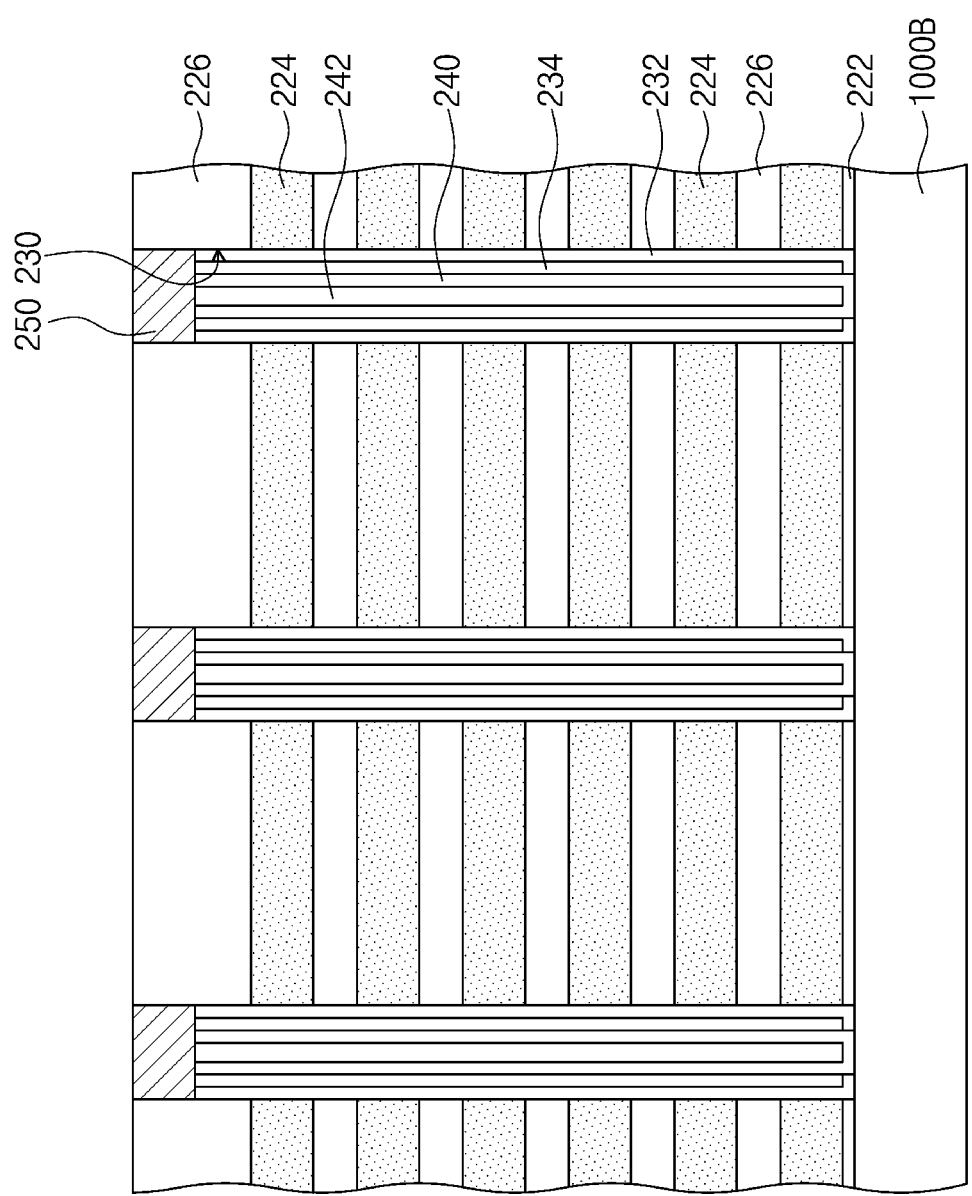

Referring to FIG. 5C, a charge storage pattern 232, a tunnel insulation pattern 234, a semiconductor pattern 240, and a buried insulating layer 242 may be formed in each channel hole 230. The charge storage pattern 232 may cover the inner wall of the channel hole 230. The charge storage pattern 232 may include, for example, a silicon nitride layer. The tunnel insulation pattern 234 may be formed on the sidewall of the charge storage pattern 232 in each channel hole 230. The tunnel insulation pattern 234 may include, for example, a silicon oxide layer. The semiconductor pattern 240 may be formed in each channel hole 230 to cover the sidewall of the tunnel insulation pattern 234 and the top surface of the substrate 1000B. The semiconductor pattern 240 may play the role of a channel region. The buried insulating layer 242 may be formed on the semiconductor pattern 240 to fill each channel hole 230. The buried insulating layer 242 may be formed using, for example, a high-density plasma oxide layer, a spin on glass (SOG) layer, and/or a CVD oxide layer. The charge storage pattern 232, the tunnel insulation pattern 234, the semiconductor pattern 240 and the buried insulating layer 242 may be localized in each channel hole 230.

Conductive pads 250 may be formed on the top portions of the channel holes 230, respectively. Each of the conductive pads 250 may be formed on the charge storage pattern 232, the tunnel insulation pattern 234, the semiconductor pattern 240, and the buried insulating pattern 242. The conductive pads 250 may be formed using an impurity doped semiconductor material or a conductive material such as a metal. The bottom surface of the conductive pads 250 may be positioned at a higher level than the upper surface of the uppermost sacrificing layer 224. The conductive pads 250 may function as drain regions.

Though not shown, a capping layer may be further formed on the uppermost insulating layer 226 and the conductive pads 250. The capping layer may include an insulating material.

Figure 5D:
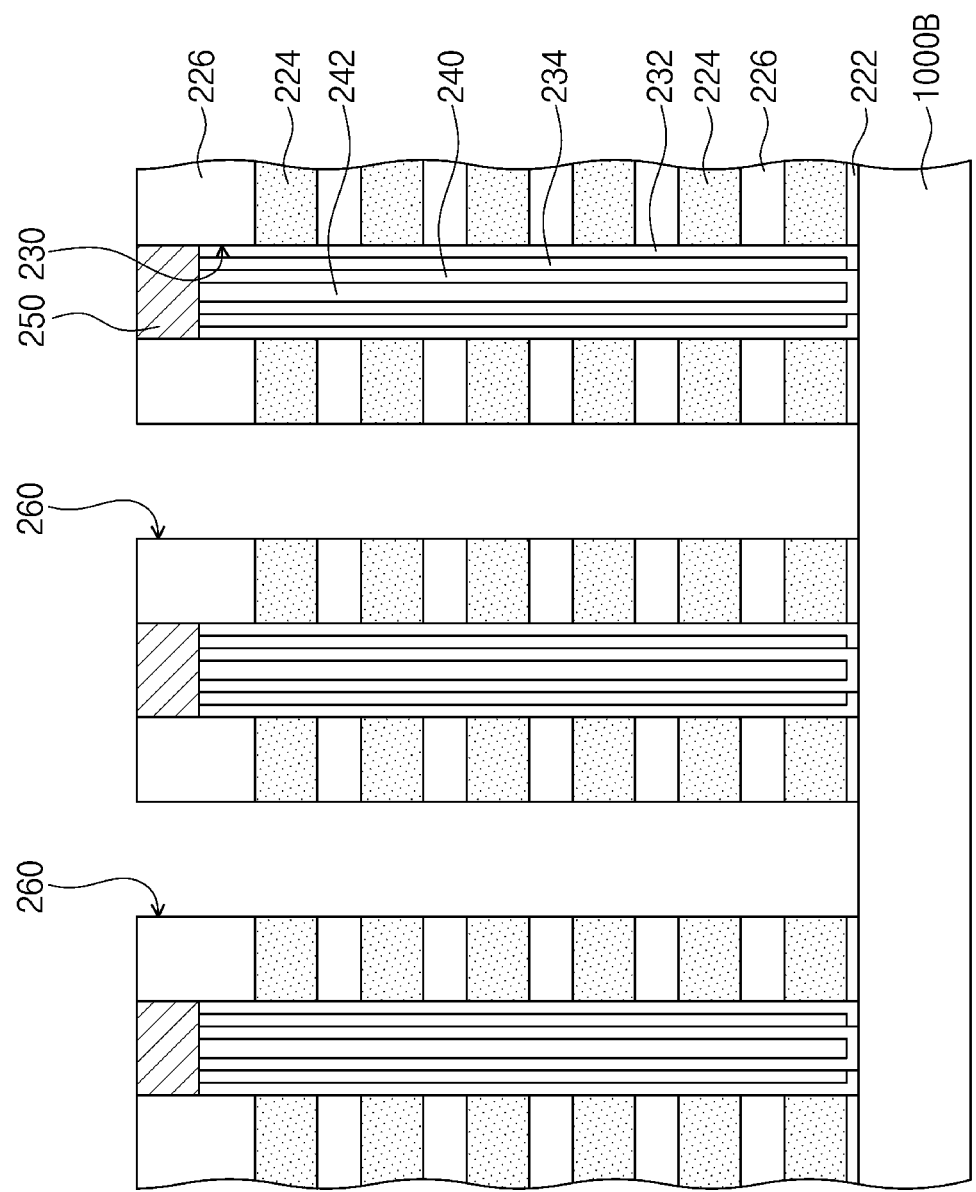

Referring to FIG. 5D, openings 260 may be formed to penetrate the insulating layers 226, the sacrificing layers 224 and the etch stopping layer 222. The openings 260 may expose the substrate 1000B. Each of the openings 260 may be a word line cut region.

Figure 5E:
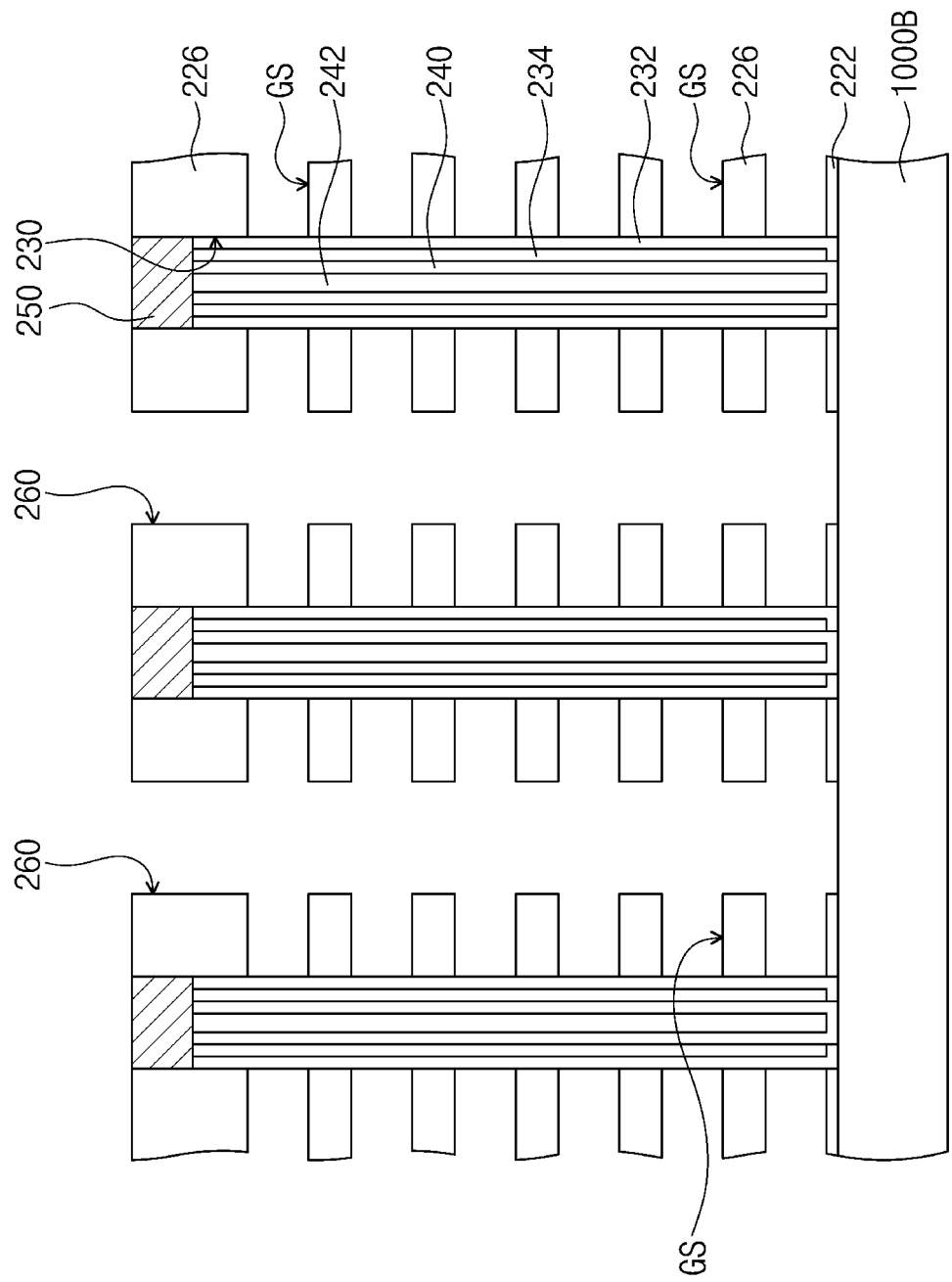

Referring to FIG. 5E, the sacrificing layers 224 exposed by the openings 260 may be removed to form gate regions GS. The removal of the sacrificing layers 224 may be performed by an etching process. The gate regions GS may be provided between the etch stopping layer 222 and the lowermost insulating layer 226, and between the insulating layers 226. The gate regions GS may be vacant spaces. The gate regions GS may be connected with at least one among the openings 260. The gate regions GS may expose the charge storage pattern 232.

Figure 5F:
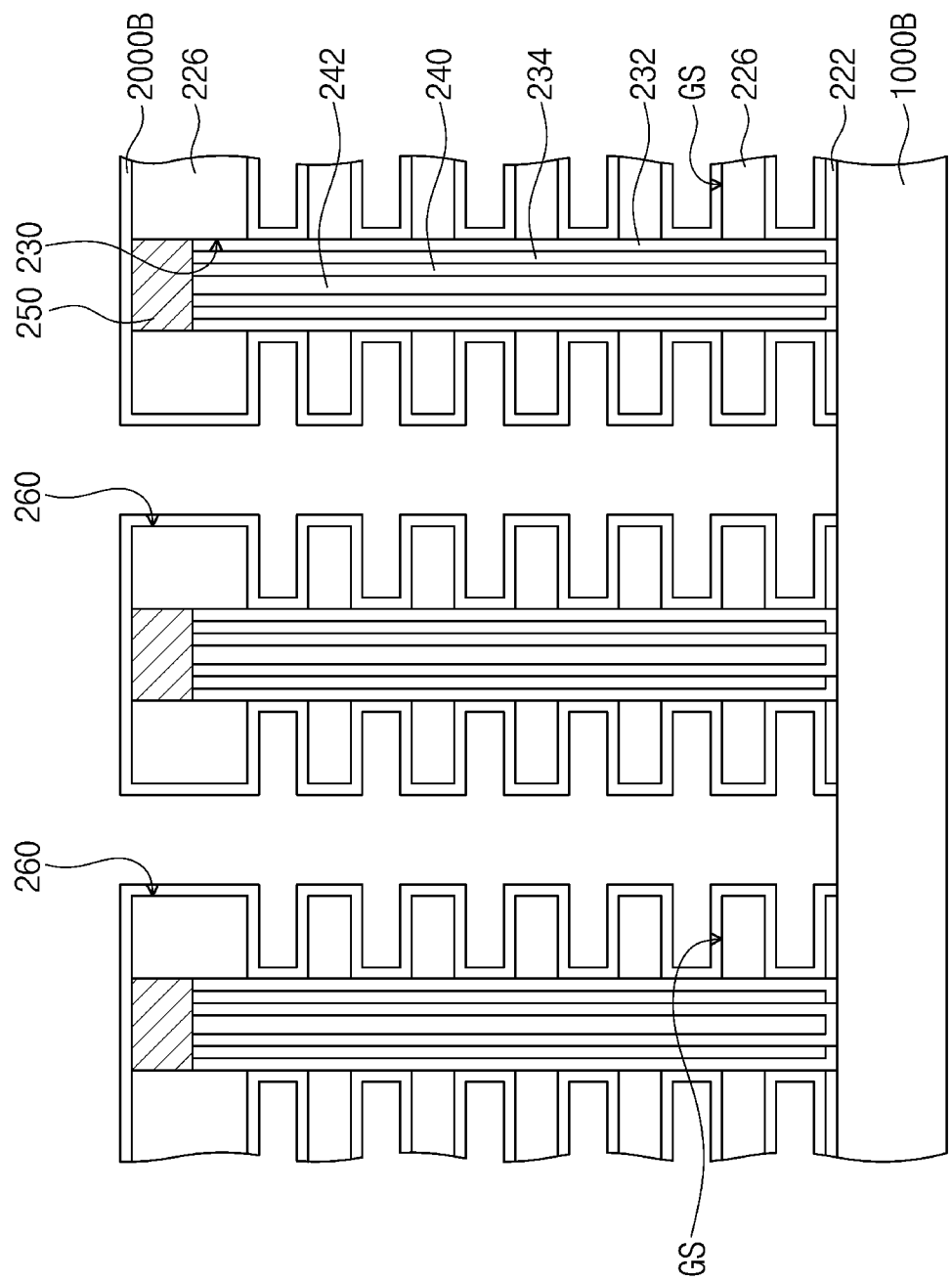

Referring to FIG. 5F, a blocking insulating layer 2000B may be formed to cover the inner walls of the gate regions GS. The blocking insulating layer 2000B may include an aluminum-containing layer.

The blocking insulating layer 2000B may be formed by the thin film forming method explained above referring to FIG. 1, FIG. 2, FIG. 3A and FIG. 3B. For example, the blocking insulating layer 2000B may be formed by a deposition process using a deposition precursor including an aluminum compound. The deposition process may be an atomic layer deposition (ALD) process. The deposition precursor may be supplied via the openings 260. The aluminum compound according to exemplary embodiments may have thermal stability and the blocking insulating layer 2000B may be formed to have a thin thickness. For example, the blocking insulating layer 2000B may be a single thin film and may have a thickness of about 0.05 Å to about 0.6 Å. In another embodiment, the blocking insulating layer 2000B may include a plurality of thin films, and each thin film may have a thickness of about 0.05 Å to about 0.6 Å. The blocking insulating layer 2000B may show excellent properties.

The deposition process may be performed at about 300° C. to about 600° C. The forming of the blocking insulating layer 2000B may further include annealing at about 500° C. to about 1,150° C. The blocking insulating layer 2000B may be densified by the annealing process.

Figure 5G:
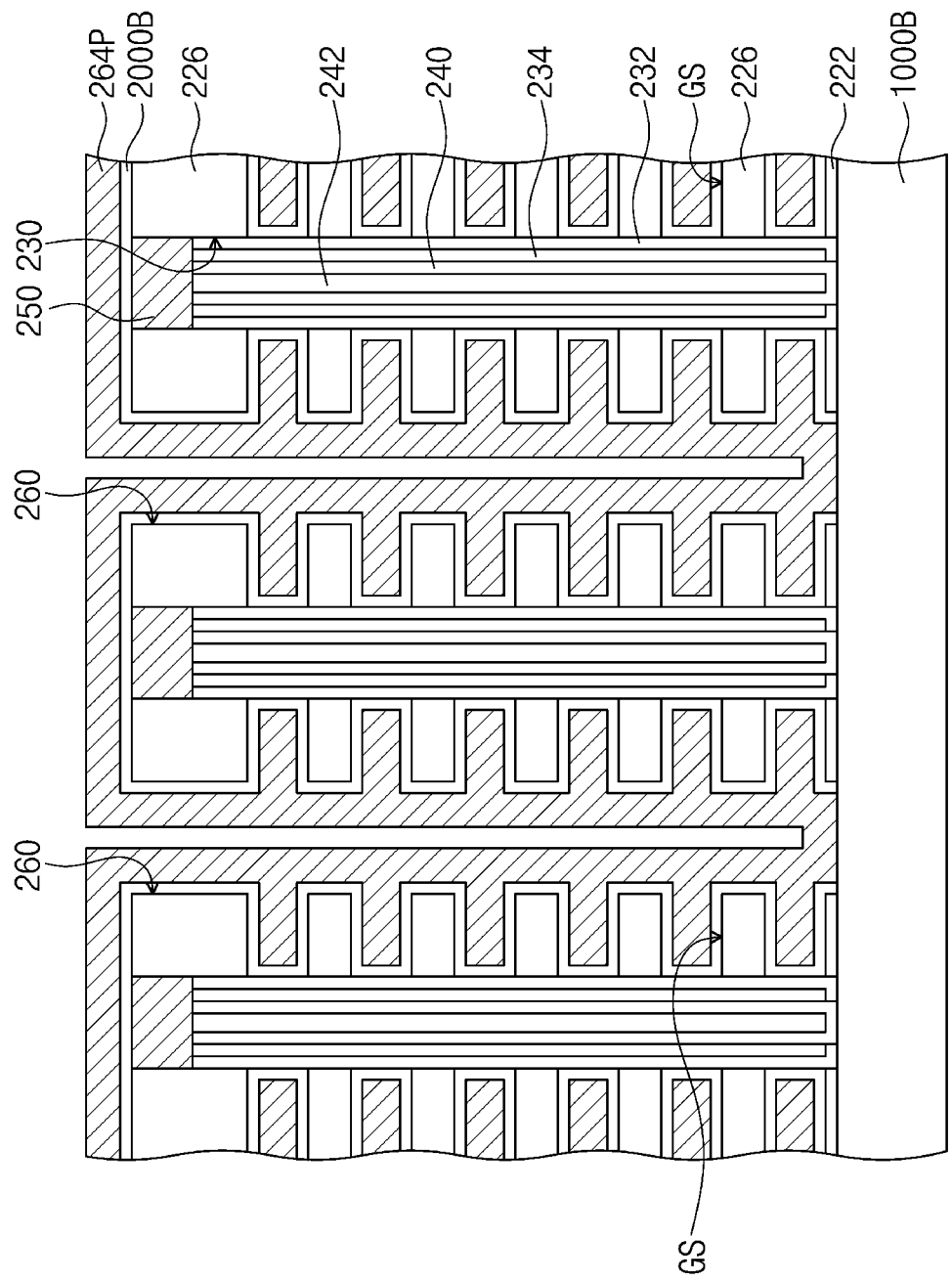

Referring to FIG. 5G, a gate conductive layer 264P may be formed on the blocking insulating layer 2000B. The gate conductive layer 264P may fill in the gate regions GS. The gate conductive layer 264P may include a first conductive barrier layer and a first conductive layer. The first conductive barrier layer may include a conductive metal nitride, for example, TiN or TaN. The first conductive barrier layer may make physical contact with the blocking insulating layer 2000B. The first conductive layer may include a conductive polysilicon, a metal, a metal silicide, or a combination thereof.

Figure 5H:
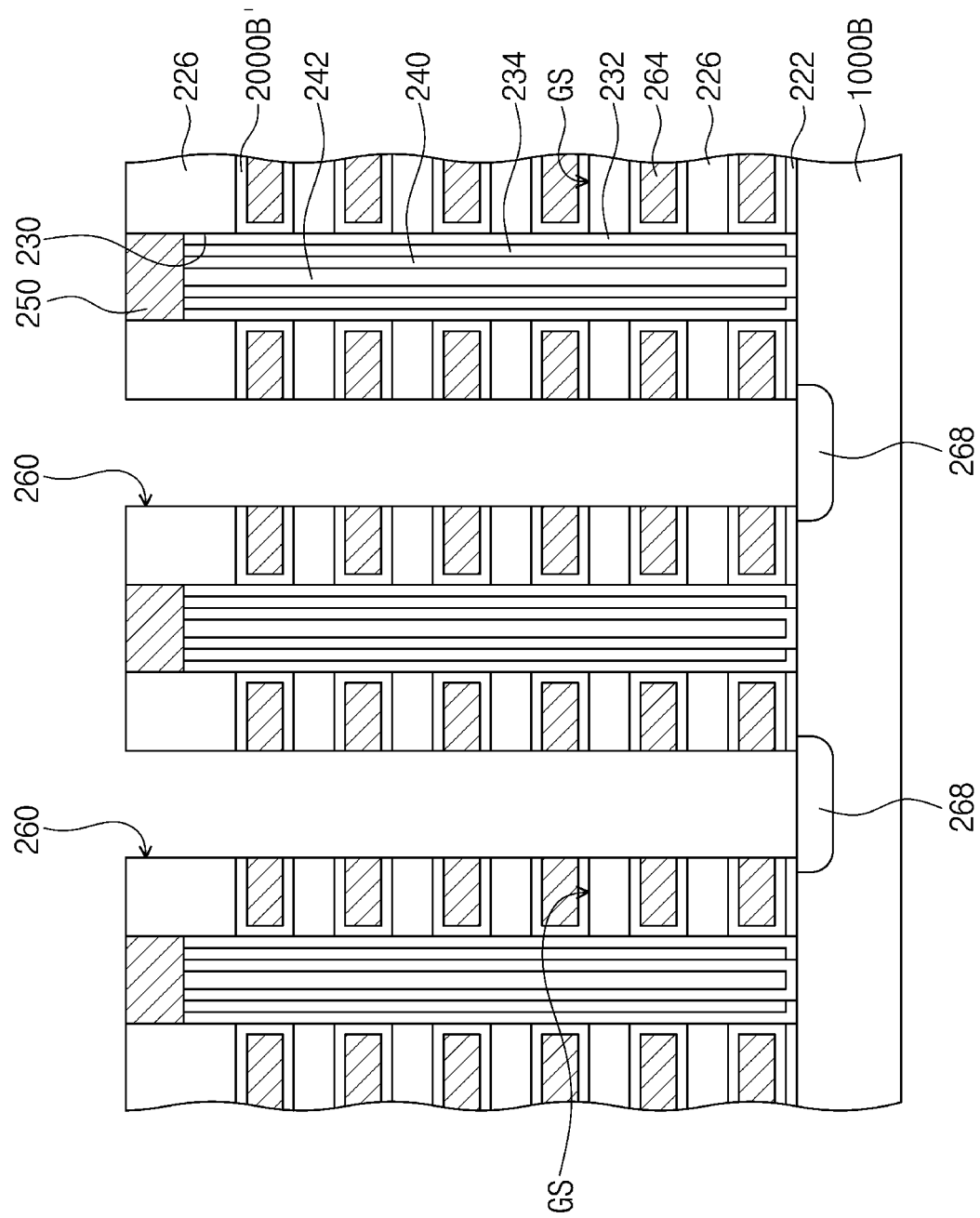

Referring to FIG. 5H, the gate conductive layer 264P and the blocking insulating layer 2000B may be patterned to form gate electrodes 264 and blocking insulation patterns 2000B', respectively. The patterning of the gate conductive layer 264P and the blocking insulating layer 2000B may be performed by an etching process. The patterning of the gate conductive layer 264P and the blocking insulating layer 2000B may be performed by a single process. The etching of the gate conductive layer 264P and the blocking insulating layer 2000B may be performed until the sidewalls of the insulating layers 226 and the upper surface of the substrate 1000B are exposed. Accordingly, gate electrodes 264 and blocking insulation patterns 2000B' may be formed.

The aluminum compound according to exemplary embodiments may not include impurities or may include a very low concentration of impurities. Accordingly, the blocking insulation patterns 2000B' may include an aluminum oxide layer which does not include impurities or include a very low concentration of impurities. The impurity may be, for example, carbon residue.

As explained referring to FIG. 5F, since the blocking insulating layer 2000B may be densified by the annealing process, during etching the blocking insulating layer 2000B and the gate conductive layer 264P, the over-etching of the blocking insulating layer 2000B may be prevented.

After forming the gate electrodes 264 and the blocking insulation patterns 2000B', impurities may be injected onto the expose substrate 1000B. Thus, common source regions 268 may be formed in the substrate 1000B.

Figure 5I:
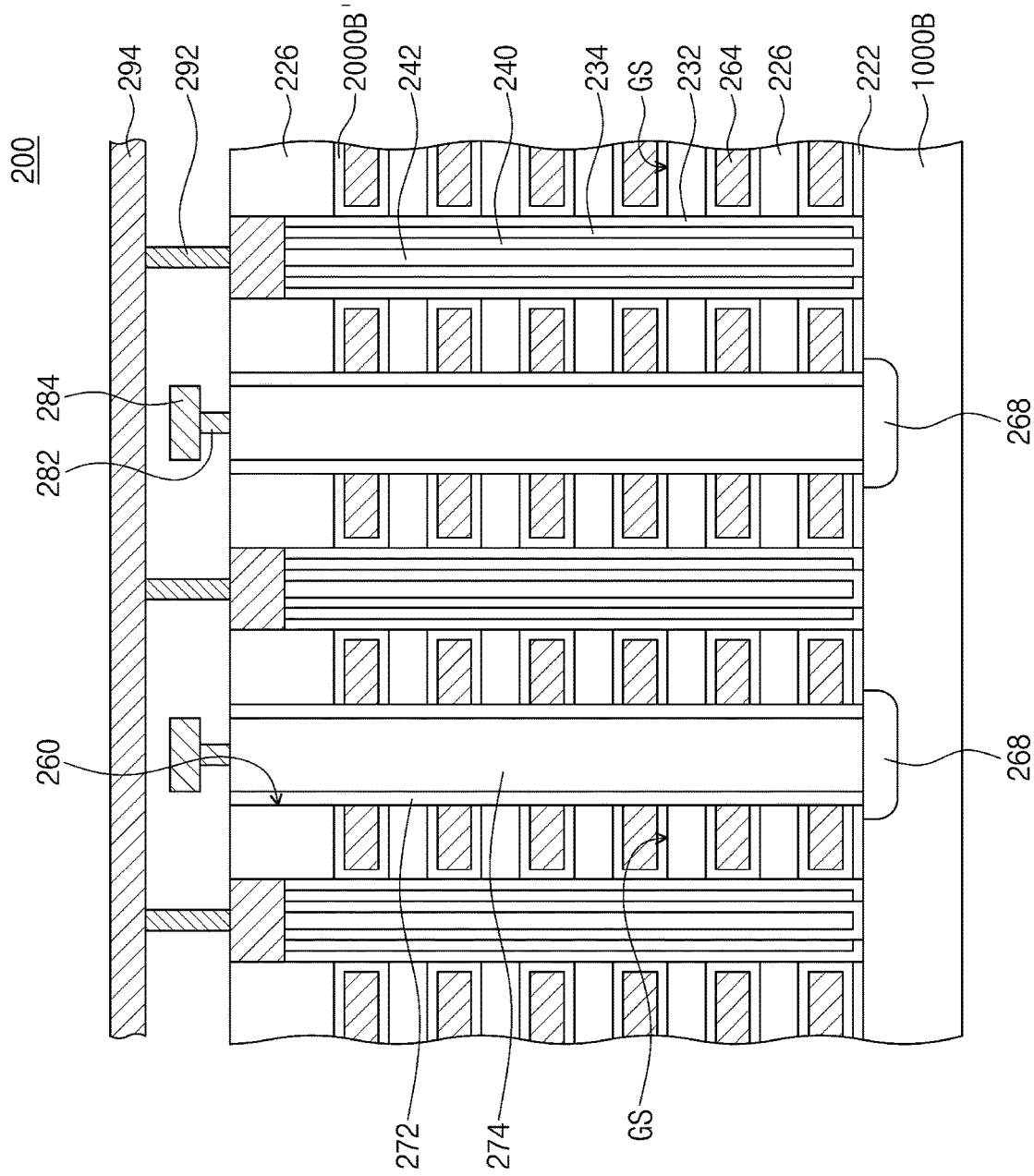

Referring to FIG. 5I, insulation spacers 272 may be formed in openings 260, respectively. The insulation spacers 272 may cover the inner sidewalls of the openings 260. The insulation spacers 272 may expose the common source regions 268. The insulation spacers 272 may include a silicon-based insulation material.

Conductive plugs 274 may be formed in the openings 260, respectively. The conductive plugs 274 may be formed on the sidewalls of the insulation spacers 272 to fill in the openings 260. The conductive plugs 274 may make connection with common source regions 268, respectively. The conductive plugs 274 may include second conductive barrier layers and second conductive layers. The second conductive barrier layers may make physical contact with corresponding insulation spacers 272, respectively. The second conductive barrier layers may include a conductive metal nitride, for example, TiN or TaN. The second conductive layer may be provided on the second conductive barrier layer and may fill in the openings 260. The second conductive layer may be formed using a metal, for example, tungsten.

First contacts 282 may be formed on the conductive plugs 274, respectively. First conductive layers 284 may be formed on the first contacts 282, respectively. The first contacts 282 and the first conductive layers 284 may be formed using a metal, a metal nitride, or a combination thereof.

Second contacts 292 may be formed on the conductive pads 250, respectively, and may make connection with the conductive pads 250, respectively. A bit line 294 may be formed in the second contacts 292 to make connection with the second contacts 292. The second contacts 292 and the bit line 294 may be formed using a metal, a metal nitride, or a combination thereof. By the forming method explained until now, a semiconductor device 200 may be manufactured. The semiconductor device 200 may be a nonvolatile memory device.

FIG. 6A to FIG. 6D are diagrams for explaining a method for manufacturing a semiconductor device according to exemplary embodiments.

Figure 6A:
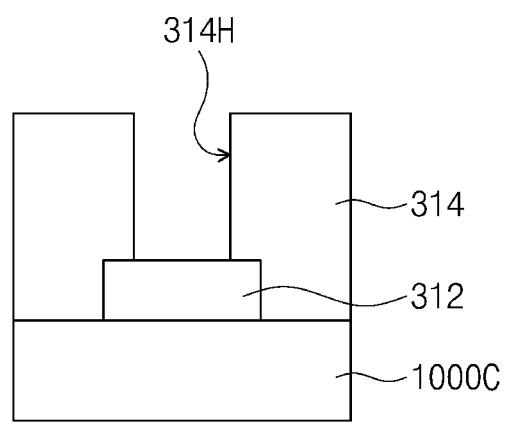
FIG. 6A to FIG. 6D are diagrams for explaining a method for manufacturing a semiconductor device according to exemplary embodiments.

Referring to FIG. 6A, a conductive pattern 312 may be formed on a substrate 1000C. The conductive pattern 312 may be source/drain regions, a gate electrode or a wiring layer. The conductive pattern 312 may include a metal or a doped semiconductor material.

An insulating interlayer pattern 314 may be formed on the substrate 1000C. The insulating interlayer pattern 314 may have a hole 314H. The hole 314H may expose at least a portion of the conductive pattern 314. The insulating interlayer pattern 312 may include a silicon-based insulation material.

Figure 6B:
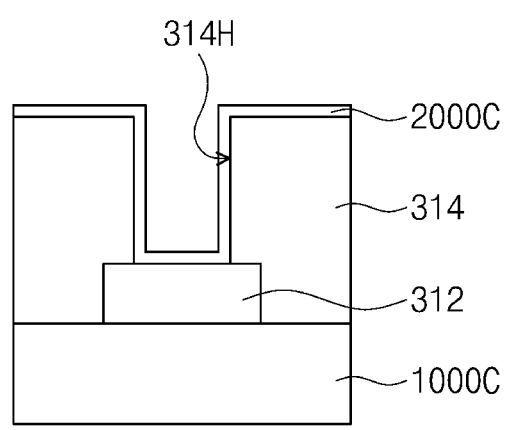

Referring to FIG. 6B, a conductive barrier layer 2000C may be formed in the hole 314H. The conductive barrier layer 2000C may conformally cover the top surface of the conductive pattern 312 exposed by the hole 314H, and the top surface and the inner sidewall of the insulating interlayer pattern 314. The conductive barrier layer 2000C may include an aluminum nitride layer.

The conductive barrier layer 2000C may be formed by the thin film forming method described above referring to FIG. 1, FIG. 2, FIG. 3A and FIG. 3B. By the deposition process using the aluminum compound according to exemplary embodiments, the conductive barrier layer 2000C may be formed. The deposition process may be an atomic layer deposition (ALD) process. The aluminum compound may have thermal stability and the conductive barrier layer 2000C may be formed to a thin thickness. For example, the conductive barrier layer 2000C may be a single thin film and may have a thickness of about 0.05 Å to about 0.6 Å. In another embodiment, the conductive barrier layer 2000C may include a plurality of thin films, and each thin film may have a thickness of about 0.05 Å to about 0.6 Å. The conductive barrier layer 2000C may show excellent properties.

Figure 6C:
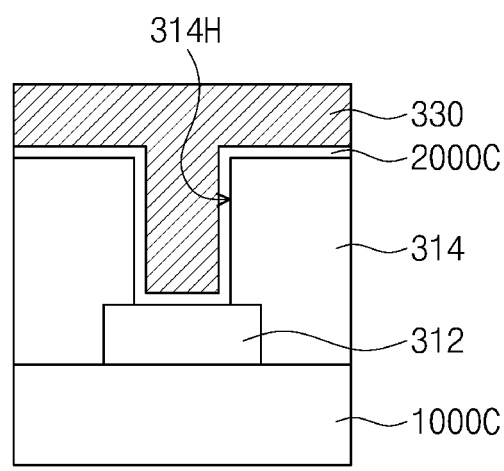

Referring to FIG. 6C, a wiring layer 330 may be formed on the conductive barrier layer 2000C to fill in the hole 314H. The top surface of the wiring layer 330 may be positioned at a higher level than the top surface of the insulating interlayer pattern 314. The wiring layer 330 may be formed using a metal, for example, tungsten or copper.

Figure 6D:
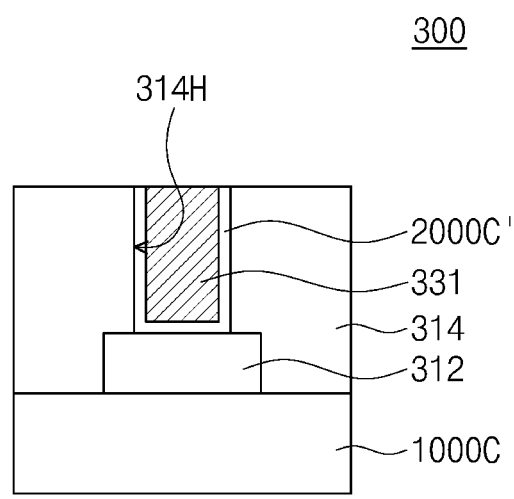

Referring to FIG. 6D, the wiring layer 330 may be planarized, and a wiring pattern 331 may be formed. The planarization of the wiring layer 330 may be performed by an etch back process or a chemical mechanical polishing process. During the planarization process of the wiring layer 330, a portion of the conductive barrier layer 2000C may be removed together to form a conductive barrier pattern 2000C'. A portion of the conductive barrier layer 2000C may be a part provided on the top surface of the insulating interlayer pattern 314. The planarization of the wiring layer 330 may be performed until the top surface of the insulating interlayer pattern 314 is exposed. The wiring pattern 331 and the conductive barrier pattern 2000C' may be localized in the hole 314H. Accordingly, the manufacture of a semiconductor device 300 may be completed. Since the conductive barrier pattern 2000C' has a thin thickness, the semiconductor device 300 may be highly integrated and miniaturized.

Figure 7A:
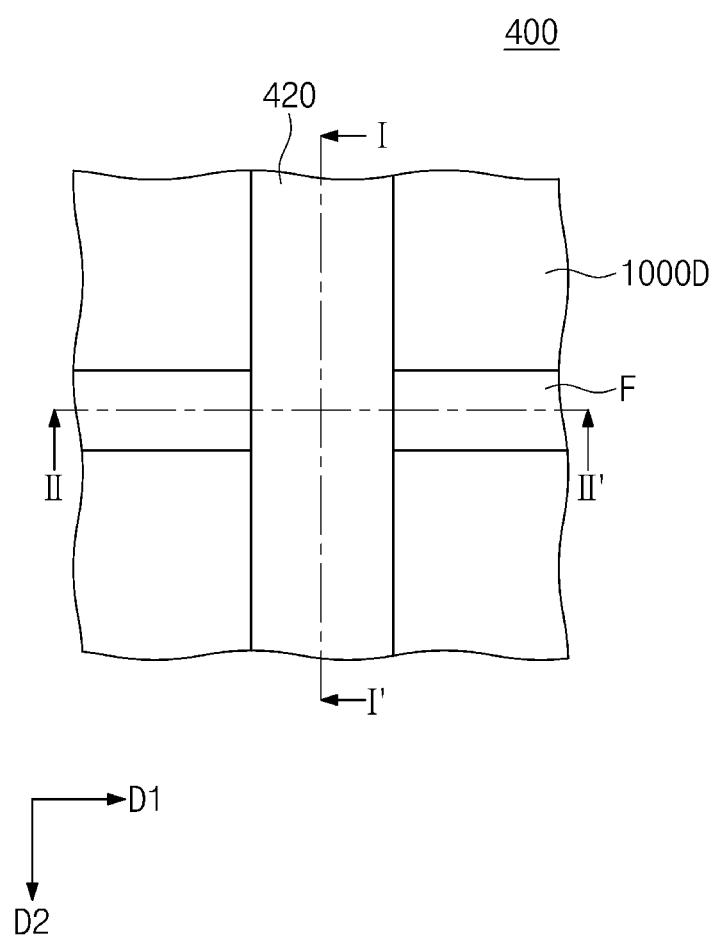
FIG. 7A is a plan view showing a semiconductor device according to exemplary embodiments.
Figure 7B:
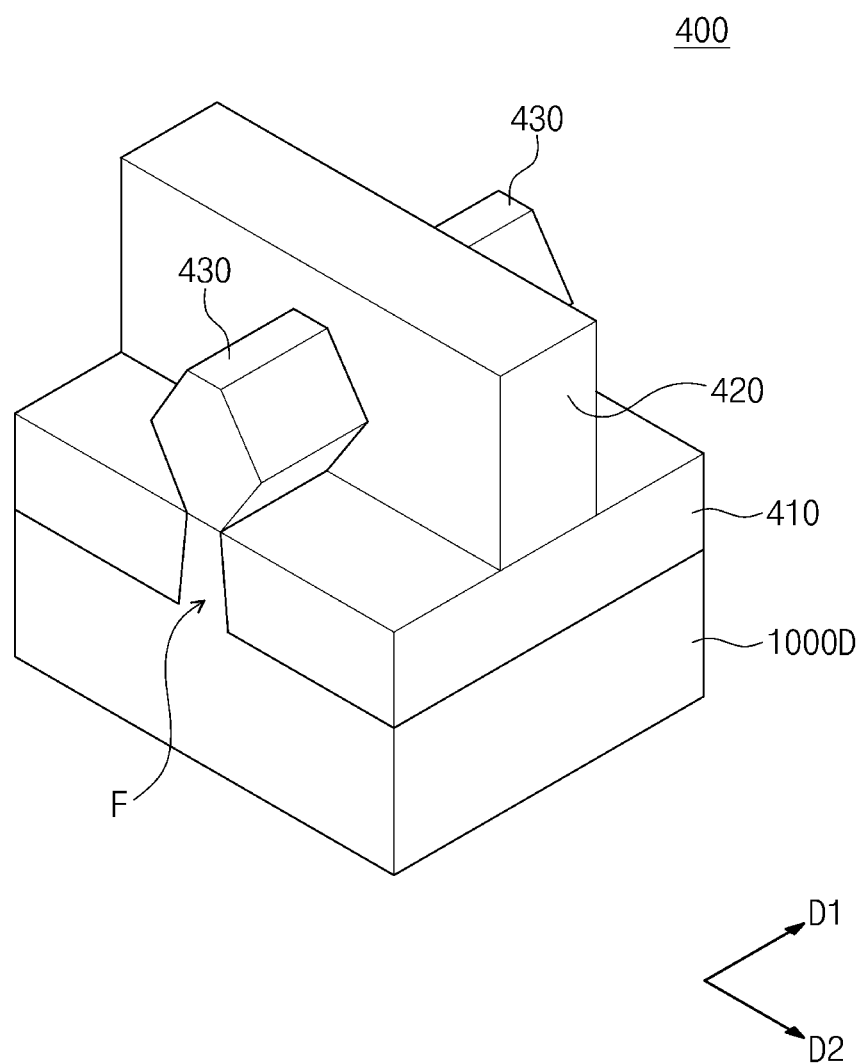
FIG. 7B is a perspective view showing the semiconductor device of FIG. 7A.

FIG. 7A is a plan view showing a semiconductor device according to exemplary embodiments. FIG. 7B is a perspective view showing the semiconductor device of FIG. 7A. FIG. 7C is a diagram for explaining the method for manufacturing a semiconductor device according to exemplary embodiments and is cross-section taken along lines I-I' and II-II' in FIG. 7A.

Referring to FIG. 7A to FIG. 7C, a semiconductor device 400 may include a substrate 1000D, a device isolation layer 410, and a gate structure 420. The semiconductor device 400 may be a transistor. The substrate 1000D may have a protruded fin part F. The fin part F may be extended in a first direction D1. The first direction D1 may be parallel to the bottom surface of the substrate 1000D. The device isolation layer 410 may be formed on the substrate 1000D to cover the lower sidewall of the fin part F. The device isolation layer 410 may include a silicon oxide layer, a silicon nitride layer, a silicon oxynitride layer, or a combination thereof. The device isolation layer 410 may expose the upper portion of the fin part F.

The gate structure 420 may be formed on the substrate 1000D to cut cross the fin part F. The gate structure 420 may be extended in a second direction D2. The second direction D2 may be parallel to the bottom surface of the substrate 1000D and cross the first direction D1.

The source/drain regions 430 may be formed at both sides of the fin part F. The source/drain regions 430 may be formed by performing a selective epitaxial growth process using the fin part F as a seed. The source/drain regions 430 may include silicon, silicon germanium, and/or silicon carbide. The shape of the source/drain regions 430 may be diverse.

As in FIG. 7C, the gate structure 420 may include a stacked interface layer 412, a high-k dielectric layer 414, and a gate electrode pattern 420G. The interface layer 412 may be provided on the upper surface of the fin part F. The interface layer 412 may include a silicon-based insulating material, for example, an oxide layer, a nitride layer or an oxynitride layer. The high-k dielectric layer 414 may have a greater dielectric constant than a silicon oxide layer. For example, the high-k dielectric layer 414 may have a dielectric constant of about 10 to about 25. The high-k dielectric layer 414 may include a metal oxide or a metal oxynitride.

The gate electrode pattern 420G may include a first metal-containing layer 426, a second metal-containing layer 2000D, and a gap-fill metal layer 428. The first metal-containing layer 426 may include a P-type work function conductive material, for example, TiN. The second metal-containing layer 2000D may include a N-type work function conductive material, for example, an aluminum compound containing Ti or Ta. In another embodiment, the second metal-containing layer 2000D may include an aluminum compound including a carbon atom. In this case, the second metal-containing layer 2000D may include TiAlC, TiAlCN, TaAlC, TaAlCN, or a combination thereof. In another embodiment, the second metal-containing layer 2000D may include TiAl, TiAlN, TaAlN, or a combination thereof. The first metal-containing layer 426 and the second metal-containing layer 2000D may control the work function of the gate structure 420. Accordingly, the threshold voltage of the gate structure 420 may be controlled.

The second metal-containing layer 2000D may be formed by the thin film forming method explained above referring to FIG. 1, FIG. 2, FIG. 3A and FIG. 3B. For example, the second metal-containing layer 2000D may be formed by a deposition process using a deposition precursor including an aluminum compound. The deposition process may be an atomic layer deposition (ALD) process. The aluminum compound may have thermal stability and the second metal-containing layer 2000D may be formed to have a small thickness. For example, the second metal-containing layer 2000D may be a single thin film and may have a thickness of about 0.05 Å to about 0.6 Å. In another embodiment, the second metal-containing layer 2000D may include a plurality of thin films, and each thin film may have a thickness of about 0.05 Å to about 0.6 Å. The second metal-containing layer 2000D may show excellent properties.

The gap-fill metal layer 428 may be provided on the second metal-containing layer 2000D. The gap-fill metal layer 428 may include aluminum, W, metal nitride (for example, TiN and TaN), a metal carbide, a metal silicide, a metal aluminum carbide, a metal aluminum nitride, and/or a metal silicon nitride. The gate structure 420 may be formed by a replacement metal gate (RMG) process.

Dielectric spacers 442 may be provided at both sides of the gate structure 420. A dielectric interlayer 444 may be formed on the source/drain regions 430. The dielectric interlayer 444 may cover the sidewalls of the dielectric spacers 442. The dielectric interlayer 444 may include a silicon-based insulation material.

By the manufacturing embodiment explained until now, the manufacture of the semiconductor device 400 may be completed. The semiconductor device 400 may be a transistor. The second metal-containing layer 2000D may have a small thickness, and the semiconductor device 400 may be highly integrated and miniaturized.

Hereinafter, the aluminum compound and a method for forming a thin film using the same will be explained referring to the Experimental Examples and Comparative Examples.

In the Experimental Examples and Comparative Examples, elemental analysis may be performed using an inductively coupled plasma atomic emission spectrometer (ICP-AES).

In the Experimental Examples and Comparative Examples, a nuclear magnetic resonance analysis using a deuterated benzene solvent was performed. The nuclear magnetic resonance analysis results are shown by (chemical shift:multiplicity:number of H).

The thermal analysis in the Experimental Examples and Comparative Examples was performed using a thermogravimetry-differential thermal analysis (TG-DTA) apparatus. In this case, an argon gas was supplied in 100 ml/min. The temperature elevation rate was about 10° C./min. Temperature at a point where a weight of a sample initially supplied to an apparatus becomes 50 wt % (hereinafter, 50 wt % decrease temperature) was measured.

<Example 1> Preparation of Aluminum Compound No. 2

Trimethyl aluminum was dissolved in toluene to prepare a trimethyl aluminum/toluene solution. To a 50 ml, three-neck flask, 8.09 ml (14.6 mmol) of the trimethyl aluminum/toluene solution and 10 ml of dehydrated toluene were added. Then, the trimethyl aluminum/toluene solution was cooled to about 0° C., and 2.25 g (14.6 mmol) of N,N'-diethyl-2,4-pentanediimine was added to prepare a mixture solution. The mixture solution was stirred at about 0° C. for about 3 hours and solvents were distilled from the mixture solution to obtain 2.20 g (yield 72%) of a product.

[Elemental Analysis]
Al; 12.5 wt % (calculated value 12.8%)
C: 63.1 wt %, H: 11.5 wt %, N: 12.8 wt % (calculated values; C: 62.8%, H: 11.0%, N: 13.3%)

[Nuclear Magnetic Resonance ($^1$H-NMR) Analysis]
(4.40:s:1H)(3.04:q:4H)(1.53:s:6H)(0.95:t:6H)(−0.29:s:6H)

[Thermal Analysis]
9,614 mg of a sample was used, and 50 wt % decrease temperature was measured as about 174° C.

<Example 2> Preparation of Aluminum Compound No. 3

To a 200 ml, four-neck flask, 33.1 ml (59.6 mmol) of a trimethyl aluminum/toluene solution and 25 ml of dehydrated toluene were added. Then, the trimethyl aluminum/toluene solution was cooled to about 0° C., and 10.9 g (59.6 mmol) of N,N'-diisopropyl-2,4-pentanediimine was added to prepare a mixture solution. The mixture solution was stirred at room temperature (25° C.) for about 5 hours. Solvents were distilled from the mixture solution to obtain 12.0 g (yield 84%) of a product.

[Elemental Analysis]
Al; 11.7 wt % (calculated value 11.3%)
C: 65.2 wt %, H: 11.7 wt %, N: 11.4 wt % (calculated values; C: 65.5%, H: 11.4%, N: 11.8%)

[Nuclear Magnetic Resonance ($^1$H-NMR) Analysis]
(4.41:s:1H)(3.54:sep:2H)(1.60:s:6H)(1.20:d:12H)(−0.18:s:6H)

[Thermal Analysis]
10,197 mg of a sample was used, and 50 wt % decrease temperature was measured as about 188° C.

<Example 3> Preparation of Aluminum Compound No. 5

To a 300 ml, four-neck flask, 81 ml (146 mmol) of the trimethyl aluminum/toluene solution and 80 ml of dehydrated toluene were added. Then, the solution was stirred and cooled to about 0° C. 26.6 g (146 mmol) of N,N'-diethyl-3,5-heptanediimine was added to prepare a mixture solution. The temperature of the mixture solution was elevated to about 60° C. and the mixture solution was stirred at about 60° C. for about 4 hours. Solvents were distilled from the mixture solution to obtain 28.9 g (yield 83%) of a product.

[Elemental Analysis]
Al; 11.1 wt % (calculated value 11.3%)
C: 65.8 wt %, H: 11.3 wt %, N: 11.8 wt % (calculated values; C: 65.5%, H: 11.4%, N: 11.8%)

[Nuclear Magnetic Resonance ($^1$H-NMR) Analysis]
(0.90:s:1H)(3.11:q:4H)(1.91:q:4H)(1.01:t:6H)(0.91:t:6H)(−0.29:s:6H)

[Thermal Analysis]
9,456 mg of a sample was used, and 50 wt % decrease temperature was measured as about 181° C.

<Example 4> Preparation of Aluminum Compound No. 7

To a 300 ml, four-neck flask, 46 ml (83.2 mmol) of the trimethyl aluminum/toluene solution was added, and the resultant solution was cooled to about 20° C. 19.8 g (83.2 mmol) of N,N'-di-sec-butyl-3,5-heptanediimine was added to the cooled solution to prepare a mixture solution. The mixture solution was stirred at room temperature (25° C.) for about 5 hours. Solvents were distilled from the mixture solution to obtain 12.9 g (yield 53%) of a product.

[Elemental Analysis]
Al; 9.6 wt % (calculated value 9.2%)
C: 68.5 wt %, H: 12.4 wt %, N: 9.5 wt % (calculated values; C: 69.3%, H: 12.0%, N: 9.5%)

[Nuclear Magnetic Resonance ($^1$H-NMR) Analysis]
(4.56:s: 1H)(3.33:sext:2H)(2.02:qt:4H)(1.67:m:4H)(1.27:t:6H)(0.95:t:6H)(0.80:td:6H)(−0.232:t:6H)

[Thermal Analysis]
9,986 mg of a sample was used, and 50 wt % decrease temperature was measured as about 208° C.

<Example 5> Preparation of Aluminum Compound No. 19

To a 100 ml, three-neck flask, 14.3 g (107 mmol) of aluminum chloride and 200 ml of dehydrated toluene were added and stirred to prepare a first solution. The first solution was cooled to about 10° C.

A 500 ml, three-neck flask was prepared, and 20.1 g (107 mmol) of N,N'-diethyl-3,5-heptanediimine and 200 ml of dehydrated toluene were added thereto and stirred to prepare a second solution. The second solution was cooled to about 10° C. To the cooled second solution, 65.2 ml (107 mmol) of a n-butyllithium solution dissolved in n-hexane was added drop-wisely. Then, the temperature of the second solution was elevated to room temperature (25° C.), and the second solution was stirred for about 2 hours.

The first solution was added to the second solution drop-wisely, and stirred at room temperature for about 5 hours to prepare a mixture solution. The mixture solution was filtered, and the solvents of the mixture solution was distilled and separated to obtain 15.3 g of an intermediate (aluminum compound No. 47). 1.89 g (6.77 mmol) of the intermediate and 50 ml of dehydrated toluene were added to a three-neck flask and stirred, followed by cooling to about −30° C. To the intermediate, 19.3 ml (13.5 mmol) of an isopropyl lithium solution dissolved in n-pentane was added. After that, the intermediate was stirred at room temperature for about 3 hours to obtain a product. The product was filtered, and solvents were distilled to obtain 0.78 g (yield 39%) of a final product.

[Elemental Analysis]

Al; 8.6 wt % (calculated value 9.2%)

C: 70.5 wt %, H: 11.7 wt %, N: 9.2 wt % (calculated values; C: 69.3%, H: 12.0%, N: 9.5%)

[Nuclear Magnetic Resonance ($^1$H-NMR) Analysis]

(4.37:s:1H)(3.07:q:4H)(1.91:q:4H)(1.46:d:12H)(1.01:t:6H)(0.94:t:6H)(0.58:sep:2H)

[Thermal Analysis]

10,371 mg of a sample was used, and 50 wt % decrease temperature was measured as about 214° C.

<Example 6> Preparation of Aluminum Compound No. 26

To a 100 ml, three-neck flask, 14.3 g (107 mmol) of aluminum chloride and 200 ml of dehydrated toluene were added and stirred to prepare a first solution. The first solution was cooled to about 10° C.

A 500 ml, three-neck flask was separately prepared, and 20.1 g (107 mmol) of N,N'-diethyl-3,5-heptanediimine and 200 ml of dehydrated toluene were added thereto and stirred to prepare a second solution. The second solution was cooled to about 0° C. To the cooled second solution, 65.2 ml (107 mmol) of a n-butyllithium solution dissolved in n-hexane was added drop-wisely. The temperature of the second solution was elevated to room temperature, and the second solution was stirred at room temperature for about 2 hours. The first solution was added to the second solution drop-wisely to prepare a mixture solution. The mixture solution was stirred at room temperature for about 5 hours. The mixture solution was filtered, and the solvents were distilled and separated to obtain 15.3 g of an intermediate (aluminum compound No. 47). 0.973 g (3.49 mmol) of the intermediate and 50 ml of dehydrated toluene were added to a three-neck flask and stirred.

Isopropylmagnesium chloride was dissolved in tetrahydrofuran (THF) to prepare an isopropylmagnesium chloride solution. To the intermediate solution, 3.5 ml (3.49 mmol) of the isopropylmagnesium chloride solution was added. The intermediate solution was heated to about 70° C. and stirred for about 5 hours to obtain a product. Solvents were distilled from the product to obtain 0.54 g (yield 54%) of a final product.

[Elemental Analysis]

Al; 8.9 wt % (calculated value 9.4%)

C: 57.9 wt %, H: 10.8 wt %, N: 10.4 wt %, Cl: 11.5 wt % (calculated values; C: 58.6%, H: 9.8%, N: 9.8%, Cl: 12.4%)

[Nuclear Magnetic Resonance ($^1$H-NMR) Analysis]

(4.47:s:1H)(3.18:qdd:4H)(1.86:qdd:4H)(1.41:t:6H)(1.08:t:6H)(0.85:td:6H)(0.66:m:1H)

[Thermal Analysis]

10,005 mg of a sample was used, and 50 wt % decrease temperature was measured as about 224° C.

<Example 7> Preparation of Aluminum Compound No. 27

To a 500 ml, four-neck flask, 8.68 g (65.1 mmol) of aluminum chloride and 100 ml of dehydrated toluene were added to prepare a first solution.

A 200 ml, four-neck flask was separately prepared, and 13.7 g (65.1 mmol) of N,N'-diisopropyl-3,5-heptanediimine and 100 ml of dehydrated toluene were added thereto and stirred to prepare a second solution. The second solution was cooled to about 30° C. To the cooled second solution, 42 ml of a n-butyllithium solution dissolved in n-hexane was added drop-wisely. The temperature of the second solution was elevated to room temperature, and the second solution was stirred for about 2 hours. The first solution was added to the second solution drop-wisely to prepare a mixture solution. The mixture solution was stirred at room temperature for about 18 hours. The mixture solution was filtered, and the solvents were distilled and separated to obtain 15.9 g of an intermediate (aluminum compound No. 48).

1.72 g (5.60 mmol) of the intermediate and 50 ml of dehydrated toluene were added to a three-neck flask and stirred. The intermediate was cooled to about −20° C. isopropylmagnesium chloride was dissolved in tetrahydrofuran (THF) to prepare an isopropylmagnesium chloride solution.

To the intermediate solution, 5.60 ml (5.60 mmol) of the isopropylmagnesium chloride solution was added. The intermediate solution was heated to about 70° C. and stirred for about 22 hours to obtain a product. Solvents were distilled from the product to obtain 0.70 g (yield 40%) of a final product.

[Elemental Analysis]

Al; 8.0 wt % (calculated value 8.6%)

C: 62.0 wt %, H: 9.8 wt %, N: 8.2 wt %, Cl: 12.0 wt % (calculated values; C: 61.0%, H: 10.2%, N: 8.9%, Cl: 11.3%)

[Nuclear Magnetic Resonance ($^1$H-NMR) Analysis]

(4.45:s:1H)(3.63:m:2H)(1.93:m:4H)(1.49:d:6H)(1.38:d:6H)(1.32:d:6H)(0.87:t:6H)(0.55:sep:1H)

[Thermal Analysis]

9,601 mg of a sample was used, and 50 wt % decrease temperature was measured as about 222° C.

<Example 8> Preparation of Aluminum Compound No. 33

To a 1 L, four-neck flask, 26.7 g (200 mmol) of aluminum chloride and 150 ml of dehydrated toluene were added and stirred to prepare a first solution. The first solution was cooled to about 20° C. 30.6 g (600 mmol) of lithium dimethylamide was dissolved in A dehydrated toluene solvent to prepare a lithium dimethylamide solution. To the cooled first solution, 300 ml of the lithium dimethylamide solution was added drop-wisely to prepare a mixture solution. The mixture solution was heated to about 50° C. and stirred for about 7 hours. The mixture solution was filtered, and the solvents were distilled to obtain 30.6 g of an intermediate. To a 200 ml, four-neck flask, 4.86 g (15.2 mmol) of the intermediate and 100 ml of dehydrated toluene were added and stirred. After that, 5.54 g (30.4 mol) of N,N'-diethyl-3,5-heptanediimine was additionally added and stirred to obtain a product. The stirring was performed at about 100° C. for about 12 hours. The solvents were distilled from the product to obtain 4.27 g (yield 47%) of a final product.

[Elemental Analysis]

Al; 9.8 wt % (calculated value 9.1%)

C: 59.2 wt %, H: 11.5 wt %, N: 19.5 wt % (calculated values; C: 60.8%, H: 11.2%, N: 18.9%)

[Nuclear Magnetic Resonance ($^1$H-NMR) Analysis]

(4.47:s: 1H)(3.24:q:4H)(2.89:s: 12H)(1.96:q:4H)(1.08:t:6H)(0.94:t:6H)

[Thermal Analysis]

9,936 mg of a sample was used, and 50 wt % decrease temperature was measured as about 205° C.

<Example 9> Preparation of Aluminum Compound No. 34

To a 500 ml, four-neck flask, 8.68 g (65.1 mmol) of aluminum chloride and 100 ml of dehydrated toluene were added and stirred to prepare a first solution.

To a 200 ml, four-neck flask, 13.7 g (65.1 mmol) of N,N'-diisopropyl-3,5-heptanediimine and 100 ml of dehydrated toluene were added and stirred to prepare a second solution. The second solution was cooled to about −30° C. To the second solution, 42 ml of a n-butyllithium solution dissolved in n-hexane was added drop-wisely, the temperature of the second solution was elevated to room temperature, and the second solution was stirred for about 2 hours. The first solution was added to the second solution drop-wisely to prepare a mixture solution. The mixture solution was stirred at room temperature for about 18 hours.

The mixture solution was filtered, and the solvents were distilled and separated to obtain 15.8 g of an intermediate (Compound No. 48). 1.89 g (6.16 mmol) of the intermediate and 50 ml of dehydrated toluene were added to a three-neck flask and stirred. Then, the intermediate was cooled to about −20° C. 30.6 g (600 mmol) of lithium dimethylamide was dissolved in a dehydrated toluene solvent to prepare a lithium dimethylamide solution.

To the intermediate, 15 ml of the lithium dimethylamide solution was added to prepare an intermediate solution. The intermediate solution was heated to room temperature and stirred for about 6 hours to obtain a product. The product was filtered. Solvents were distilled from the product to obtain 1.34 g (yield 67%) of a final product.

[Elemental Analysis]

Al; 9.0 wt % (calculated value 8.3%)

C: 62.2 wt %, H: 10.2 wt %, N: 18.6 wt % (calculated values; C: 62.9%, H: 11.5%, N: 17.3%)

[Nuclear Magnetic Resonance ($^1$H-NMR) Analysis]

(4.43:s:1H)(3.72:sep:2H)(2.75:s:12H)(2.04:q:4H)(1.30:d:12H)(0.98:t:6H)

[Thermal Analysis]

9,976 mg of a sample was used, and 50 wt % decrease temperature was measured as about 214° C.

<Example 10> Preparation of Aluminum Compound No. 40

To a 500 ml, four-neck flask, 14.3 g (107 mmol) of aluminum chloride and 200 ml of dehydrated toluene were added and stirred to prepare a first solution. The first solution was cooled to about 10° C.

To a 500 ml, three-neck flask, 20.1 g (107 mmol) of N,N'-diethyl-3,5-heptanediimine and 200 ml of dehydrated toluene were added and stirred to prepare a second solution. The second solution was cooled to about 0° C.

To the second solution, 65.2 ml of a n-butyllithium solution dissolved in n-hexane was added drop-wisely. The temperature of the second solution was elevated to room temperature, and the second solution was stirred for about 2 hours. The first solution was added to the second solution drop-wisely to prepare a mixture solution. The mixture solution was stirred at room temperature for about 5 hours. The mixture solution was filtered, and the solvents were distilled and separated to obtain 15.3 g of an intermediate (Compound No. 47). 1.21 g (4.33 mmol) of the intermediate and 10 ml of dehydrated toluene were added to a three-neck flask and stirred to obtain an intermediate solution. The intermediate was cooled to about −20° C. 0.221 g (4.33 mmol) of lithium dimethylamide was dissolved in a dehydrated toluene solvent to prepare a lithium dimethylamide solution. To the intermediate solution, 10 ml of the lithium dimethylamide solution was added drop-wisely and then was stirred at room temperature for about 5 hours to obtain a product. The product was filtered. Solvents were distilled from the product to obtain 0.25 g (yield 20%) of a final product.

[Elemental Analysis]

Al; 10.2 wt % (calculated value 9.4%)

C: 55.3 wt %, H: 8.5 wt %, N: 13.5 wt %, Cl: 12.5 wt % (calculated values; C: 54.3%, H: 9.5%, N: 14.6%, Cl: 12.3%)

[Nuclear Magnetic Resonance ($^1$H-NMR) Analysis]

(4.51:s:1H)(3.27:qd:4H)(2.86:s:6H)(1.89:q:d:4H)(1.10:t:6H)(0.86:t:6H)

[Thermal Analysis]

10,389 mg of a sample was used, and 50 wt % decrease temperature was measured as about 220° C.

<Example 11> Preparation of Aluminum Compound No. 55

To a 300 ml, four-neck flask, 53.9 ml (97.1 mmol) of a trimethyl aluminum/toluene solution and 50 ml of dehydrated toluene were added and the solution was cooled to about 10° C. To the cooled solution, 16.4 g (97.1 mmol) of N-isopropyl-5-imino-3-heptanone was added to prepare a mixture solution.

The temperature of the mixture solution was elevated to room temperature, and the mixture solution was stirred for about 6 hours. Solvents were removed through distilling the mixture solution to obtain 19.5 g (yield 89%) of a final product.

[Elemental Analysis]

Al; 11.2 wt % (calculated value 12.0%)

C: 64.7 wt %, H: 9.7 wt %, N: 5.5 wt % (calculated values; C: 64.0%, H: 10.7%, N: 6.2%)

[Nuclear Magnetic Resonance ($^1$H-NMR) Analysis]

(4.77:s:1H)(3.43:sep:1H)(2.07:q:2H)(1.71:q:2H)(1.09:d:6H)(1.04:t:3H)(0.72:t:3H)(−0.21:s:6H)

[Thermal Analysis]

9,953 mg of a sample was used, and 50 wt % decrease temperature was measured as about 175° C.

<Example 12> Preparation of Aluminum Compound No. 69

To a 300 ml, four-neck flask, 11.9 g (89.3 mmol) of aluminum chloride and 100 ml of dehydrated toluene were added and stirred to prepare a first solution. The first solution was cooled to about 0° C.

To a 200 ml, four-neck flask, 11.4 g (89.3 mmol) of N-ethyl-4-imino-2-pentanone and 100 ml of dehydrated toluene were added and stirred to prepare a second solution. The second solution was cooled to about −40° C.

To the second solution, 57.4 ml of 89.36 mmol of n-butyllithium solution dissolved in n-hexane was added drop-wisely. The temperature of the second solution was elevated to room temperature, and the second solution was stirred for about 2 hours. The first solution was added to the second solution drop-wisely to prepare a mixture solution. The temperature of the mixture solution was elevated to room temperature and the mixture solution was stirred for about 20 hours.

The mixture solution was filtered, and the solvents were separated by distillation of the mixture solution to obtain 10.2 g of an intermediate. 1.59 g (7.10 mmol) of the intermediate and 50 ml of dehydrated toluene were added to a three-neck flask and stirred to obtain an intermediate solution. The intermediate solution was cooled to about −20° C. 14.2 ml (7.10 mmol) of isopropylmagnesium chloride was added drop-wisely to the cooled intermediate solution. The intermediate solution was heated to about 50° C. and stirred for about 4 hours to obtain a product. The product was filtered. Solvents were distilled from the product by a distillation process to obtain 0.65 g (yield 38%) of a final product.

[Elemental Analysis]

Al; 12.2 wt % (calculated value 11.3%)

C: 64.2 wt %, H: 12.0 wt %, N: 5.3 wt % (calculated values; C: 65.2%, H: 11.0%, N: 5.9%)

[Nuclear Magnetic Resonance ($^1$H-NMR) Analysis]

(4.56:s: 1H)(2.87:q:2H)(1.72:s:3H)(1.46:dd:12H)(1.24:s: 3H)(0.82:t:3H)(0.60:sep:2H)

[Thermal Analysis]

10,228 mg of a sample was used, and 50 wt % decrease temperature was measured as about 177° C.

Comparative Example 1

An aluminum compound represented by Formula 4A was prepared as the Comparative Example.

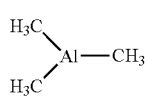

[Formula 4A]

Comparative Example 2

An aluminum compound represented by Formula 4B was prepared as the Comparative Example.

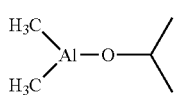

[Formula 4B]

Comparative Example 3

An aluminum compound represented by Formula 4C was prepared as the Comparative Example.

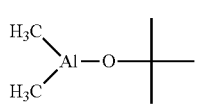

[Formula 4C]

Table 1 shows evaluation results of spontaneous ignition properties of the aluminum compounds of the Experimental Examples and the Comparative Examples. The spontaneous ignition properties are observed results on ignition after standing the aluminum compound in the atmosphere.

TABLE 1

|  | Spontaneous ignition properties |
| --- | --- |
| Comparative Example 1 | Observed |
| Comparative Example 2 | None |
| Comparative Example 3 | None |
| Experimental Example 1 | None |
| Experimental Example 2 | None |
| Experimental Example 3 | None |
| Experimental Example 4 | None |
| Experimental Example 5 | None |
| Experimental Example 6 | None |
| Experimental Example 7 | None |
| Experimental Example 8 | None |
| Experimental Example 9 | None |
| Experimental Example 10 | None |
| Experimental Example 11 | None |
| Experimental Example 12 | None |

Referring to Table 1, the aluminum compound of Comparative Example 1 has spontaneous ignition properties. The aluminum compound of Comparative Example 1 is unstable in the atmosphere, and may be difficult to be used as a deposition precursor. The aluminum compounds of Experimental Example 1 to Experimental Example 12 do not show spontaneous ignition properties. The aluminum compounds of Experimental Example 1 to Experimental Example 12 may be used as deposition precursors.

Table 2 shows measured results on the melting point and thermal decomposition temperature of Experimental Example 1 to Experimental Example 12, Comparative Example 2, and Comparative Example 3. The melting point was observed under conditions of about 1,103 Pa and about 30° C. The thermal decomposition temperature was measured using a differential scanning calorimeter.

TABLE 2

|  | Melting point | Thermal decomposition temperature |
| --- | --- | --- |
| Comparative Example 2 | Less than 30° C. | 190° C. |
| Comparative Example 3 | 80° C. | 350° C. |
| Experimental Example 1 | 40° C. | 380° C. |
| Experimental Example 2 | Less than 30° C. | 390° C. |
| Experimental Example 3 | Less than 30° C. | 390° C. |
| Experimental Example 4 | Less than 30° C. | 400° C. |
| Experimental Example 5 | Less than 30° C. | 390° C. |
| Experimental Example 6 | Less than 30° C. | 410° C. |
| Experimental Example 7 | Less than 30° C. | 400° C. |
| Experimental Example 8 | Less than 30° C. | 350° C. |
| Experimental Example 9 | Less than 30° C. | 350° C. |
| Experimental Example 10 | Less than 30° C. | 400° C. |
| Experimental Example 11 | Less than 30° C. | 320° C. |
| Experimental Example 12 | Less than 30° C. | 310° C. |

Referring to Table 2, Comparative Example 2 has a low thermal decomposition temperature. The thermal decomposition temperature of the aluminum compound of Comparative Example 2 may be less than about 300° C. In case where the aluminum compound of Comparative Example 2 is used as the deposition precursor, some limitations may be applied to a deposition process due to low thermal stability. For example, a deposition window (ALD window) may be narrow. The aluminum compounds of Experimental Example 1 to Experimental Example 12 may have a relatively high thermal decomposition temperature of about 300° C. to about 600° C. The aluminum compounds of Experimental Example 1 to Experimental Example 12 may have excellent thermal stability. Accordingly, in case where the aluminum compounds are used as deposition precursors, the limitations of a deposition process may be reduced. For example, the deposition process may be performed in a relatively wide deposition window range.

The deposition precursor may be transported in a liquid state. If the melting point of the deposition precursor increases, the preparation of the deposition precursor in a liquid state may become difficult. Comparative Example 3 may have a high melting point. For example, the melting point of Comparative Example 3 may be about 80° C. Accordingly, in case where the aluminum compound of Comparative Example 3 is used as a deposition precursor, the transportation of the deposition precursor may become difficult. The aluminum compounds of Experimental Example 1 to Experimental Example 12 may have relatively low melting points (for example, melting points of 45° C. or less). Therefore, in case where the aluminum compounds of Experimental Example 1 to Experimental Example 12 are used as deposition precursors, the transportation of the deposition precursors may be easy.

Figure 8:
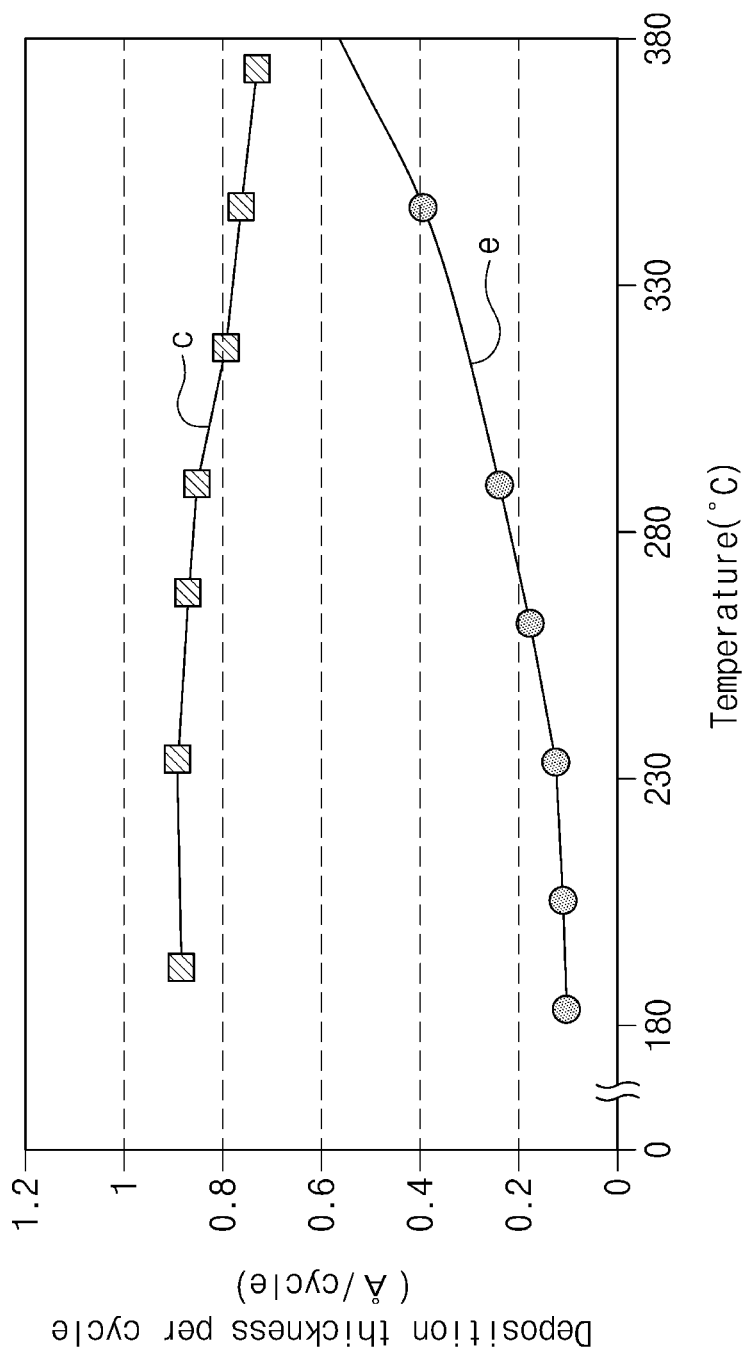
FIG. 8 shows the results on a thickness of a thin film deposited per cycle in accordance with temperature.

FIG. 8 is the result showing a deposition thickness of a thin film per cycle in accordance with temperature. The deposition process of the thin film was performed using each of the deposition precursors of Comparative Example 1 and Experimental Example 3. The horizontal axis represents the temperature of a substrate. The thin film was deposited by performing an atomic layer deposition process, and the thickness of the thin film deposited per cycle may mean a deposition rate.

Referring to FIG. 8, the thickness (c) of the thin film deposited using Comparative Example 1 is greater than the thickness (e) of the thin film deposited using Experimental Example 3 at the same temperature conditions. The deposition process using the aluminum compound according to exemplary embodiments has a slow deposition rate, and the thickness of the thin film deposited may decrease. For example, in case where Experimental Example 3 was used as a deposition precursor, the thickness (e) of thin film deposited per cycle was about 0.05 Å to about 0.6 Å.

According to an aspect of the inventive concept, an aluminum compound has a low melting point, and may be easily transported. The aluminum compound may be used as a deposition precursor. The aluminum compound may have excellent stability. A deposition process may have a wide deposition window. By a deposition process using the deposition precursor, a thin film may be formed to a thin thickness. The thin film may show improved properties.

Although the exemplary embodiments of the inventive concept have been described, it is understood that the inventive concept should not be limited to these exemplary embodiments but various changes and modifications can be made by one ordinary skilled in the art within the spirit and scope of the inventive concept as hereinafter claimed.

What is claimed is:

1. An aluminum compound represented by Formula 1:

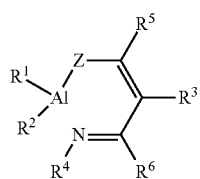

[Formula 1]

wherein, in Formula 1, $R^1$ and $R^2$ are each independently any one selected from the group consisting of an alkyl group of 1 to 6 carbon atoms, a dialkylamino group of 2 to 6 carbon atoms, an alkoxide group of 1 to 6 carbon atoms, and a halogen atom, Z is O or N—$R^7$, $R^3$ is any one selected from the group consisting of hydrogen, deuterium, and an alkyl group of 1 to 6 carbon atoms, $R^4$ and $R^7$ are each independently any one selected from the group consisting of hydrogen, deuterium, alkyl of 1 to 6 carbon atoms and (dialkylamino)alkyl of 3 to 10 carbon atoms, and $R^5$ and $R^6$ are each independently any one selected from the group consisting of hydrogen, deuterium, and an alkyl group of 1 to 6 carbon atoms, wherein $R^1$ is a dialkylamino group of 2 to 6 carbon atoms or an alkoxide group of 1 to 6 carbon atoms, $R^4$ is (dialkylamino)alkyl of 3 to 10 carbon atoms.

2. The aluminum compound of claim 1, having a thermal decomposition temperature of 350° C. to 600° C.,
wherein $R^1$ and $R^2$ are each independently a dialkylamino group of 2 to 6 carbon atoms.

3. The aluminum compound of claim 1, wherein, in Formula 1, $R^1$ and $R^2$ are each independently any one selected from the group consisting of an alkyl group of 1 to 4 carbon atoms, a dialkylamino group of 2 to 4 carbon atoms, an alkoxide group of 1 to 4 carbon atoms, and a halogen atom,
wherein $R^4$ and $R^7$ are each independently any one selected from the group consisting of an alkyl group of 1 to 4 carbon atoms and a (dialkylamino)alkyl group of 3 to 10 carbon atoms,
wherein $R^5$ and $R^6$ are each independently an alkyl group of 1 to 4 carbon atoms, and
wherein $R^3$ is hydrogen,
wherein $R^1$ is a dialkylamino A group of 2 to 4 carbon atoms or an alkoxide group of 1 to 4 carbon atoms, $R^4$ is (dialkylamino)alkyl of 3 to 10 carbon atoms.

4. The aluminum compound of claim 1, wherein, in Formula 1, $R^1$ is any one selected from the group consisting of a methyl group, a dimethylamino group, and an isopropyl group.

5. The aluminum compound of claim 1, wherein, in Formula 1, $R^2$ is any one selected from the group consisting of a methyl group, a dimethylamino group, and an isopropyl group.

6. The aluminum compound of claim 1, wherein, in Formula 1, $R^4$ is any one selected from the group consisting of a methyl group, an ethyl group, and an isopropyl group.

7. The aluminum compound of claim 1, wherein, in Formula 1, $R^7$ is any one selected from the group consisting of a methyl group, an ethyl group, and an isopropyl group.

8. The aluminum compound of claim 1, wherein, in Formula 1, $R^5$ is a methyl group or an ethyl group.

9. The aluminum compound of claim 1, wherein, in Formula 1, $R^6$ is a methyl group or an ethyl group.

10. The aluminum compound of claim 1, wherein, in Formula 1, $R^3$ is hydrogen.

11. The aluminum compound of claim 1, wherein Formula 1 has a melting point of −50° C. to 45° C.

* * * * *